US011596119B2

(12) United States Patent
Arriaza et al.

(10) Patent No.: US 11,596,119 B2
(45) Date of Patent: Mar. 7, 2023

(54) DIGITAL NUTRIENT MODELS USING SPATIALLY DISTRIBUTED VALUES UNIQUE TO AN AGRONOMIC FIELD

(71) Applicant: CLIMATE LLC, San Francisco, CA (US)

(72) Inventors: Juan Lopez Arriaza, Pleasant Hill, CA (US); John Gates, Alameda, CA (US)

(73) Assignee: CLIMATE LLC, Saint Louis, MO (US)

(*) Notice: Subject to any disclaimer, the term of this patent is extended or adjusted under 35 U.S.C. 154(b) by 600 days.

(21) Appl. No.: 16/102,577

(22) Filed: Aug. 13, 2018

(65) Prior Publication Data

US 2020/0045898 A1    Feb. 13, 2020

(51) Int. Cl.
*A01G 25/16*    (2006.01)
*A01C 21/00*    (2006.01)
(Continued)

(52) U.S. Cl.
CPC .......... *A01G 25/167* (2013.01); *A01C 21/007* (2013.01); *G01C 21/30* (2013.01);
(Continued)

(58) Field of Classification Search
CPC ..... A01G 25/167; G06F 30/27; A01C 21/007; G01C 21/30; G05B 13/0265;
(Continued)

(56) References Cited

U.S. PATENT DOCUMENTS 8,712,148 B2    4/2014  Paris et al.
8,738,243 B2    5/2014  Sauder et al.
(Continued)

FOREIGN PATENT DOCUMENTS

WO    WO 2018/081043 A1    5/2018

OTHER PUBLICATIONS

The International Searching Authority, "Search Report" in application No. PCT/US2019/042835, dated Sep. 30, 2019, 15 pages.
(Continued)

*Primary Examiner* — John E Johansen
(74) *Attorney, Agent, or Firm* — Harness, Dickey & Pierce, P.L.C.

(57) ABSTRACT

In an embodiment, an agricultural intelligence computing system stores a digital model of crop growth, the digital model of crop growth being configured to compute nutrient requirements in soil to produce particular yield values based, at least in part, on data unique to an agricultural field. The system receives agronomic field data for a particular agronomic field, the agronomic field data comprising one or more input parameters for each of a plurality of locations on the agronomic field, nutrient application values for each of the plurality of locations, and measured yield values for each of the plurality of locations. The system computes, for each location of the plurality of locations, a required nutrient value indicating a required amount of nutrient to produce the measured yield values. The system identifies a subset of the plurality of locations where the computed required nutrient value is greater than the nutrient application value. The system computes, for each of the subset of the plurality of locations, a residual value comprising a difference between the required nutrient value and the nutrient application value. The system generates a residual map comprising the residual values at the subset of the plurality of locations. Using the residual map and the one or more input parameters for each of the plurality of locations, the system generates and stores particular model correction data for the particular agronomic field.

12 Claims, 7 Drawing Sheets

(51) Int. Cl.
*G01C 21/30* (2006.01)
*G05B 19/04* (2006.01)
*G06F 30/27* (2020.01)
*G06Q 50/02* (2012.01)
*G05B 19/042* (2006.01)
*G05D 1/02* (2020.01)
*G05B 13/02* (2006.01)
*A01B 79/00* (2006.01)
*G05B 23/02* (2006.01)

(52) U.S. Cl.
CPC ....... *G05B 13/0265* (2013.01); *G05B 19/042* (2013.01); *G05B 19/0415* (2013.01); *G05D 1/0278* (2013.01); *G06F 30/27* (2020.01); A01B 79/005 (2013.01); G05B 23/0254 (2013.01); G06Q 50/02 (2013.01)

(58) Field of Classification Search
CPC .............. G05B 19/0415; G05B 19/042; G05B 23/0254; G05D 1/0278; A01B 79/005; G06Q 50/02
USPC ................................... 706/6; 703/6
See application file for complete search history.

(56) References Cited

U.S. PATENT DOCUMENTS

| | | | |
|---|---|---|---|
| 8,767,194 B2 | 7/2014 | Preiner et al. | |
| 9,652,840 B1* | 5/2017 | Shriver | G01N 33/0098 |
| 2005/0165552 A1* | 7/2005 | Fraisse | A01B 79/005 702/2 |
| 2014/0012732 A1 | 1/2014 | Lindores | |
| 2015/0094916 A1 | 4/2015 | Bauerer et al. | |
| 2016/0180473 A1* | 6/2016 | Groeneveld | A01C 21/007 705/7.25 |
| 2016/0309646 A1* | 10/2016 | Starr | A01C 21/007 |
| 2017/0061052 A1* | 3/2017 | Gates | A01G 25/167 |
| 2017/0196171 A1* | 7/2017 | Xu | H04L 43/045 |
| 2017/0316124 A1 | 11/2017 | Lee | |
| 2018/0075545 A1* | 3/2018 | Richt | G06V 20/188 |
| 2019/0050948 A1* | 2/2019 | Perry | G06V 20/188 |

OTHER PUBLICATIONS

Current Claims in application No. PCT/US2019/042835, dated Sep. 2019, 6 pages.
U.S. Appl. No. 62/220,852, filed Sep. 18, 2015.
U.S. Appl. No. 62/175,160, filed Jun. 12, 2015.
U.S. Appl. No. 14/968,728, filed Dec. 14, 2015.
International Bureau of WIPO, International Preliminary Report in application No. PCT/US2019/042835, dated Feb. 16, 2021, 9 pages.
Current Claims in application No. PCT/US2019/042835, dated Feb. 2021, 6 pages.
US 2005165552 A1 (Mosaic Co) Jul. 28, 2005 Whole document.
US 2017316124 A1 (Climate Corp) Nov. 2, 2017 Whole document.
US 2017196171 A1 (Climate Corp) Jul. 13, 2017.
WO 2018081043 A1 (Univ. Michigan State) May 3, 2018.
US 2014012732 A1 (Trimble Navigation Ltd) Jan. 9, 2014.

* cited by examiner

Fig. 2
(a)
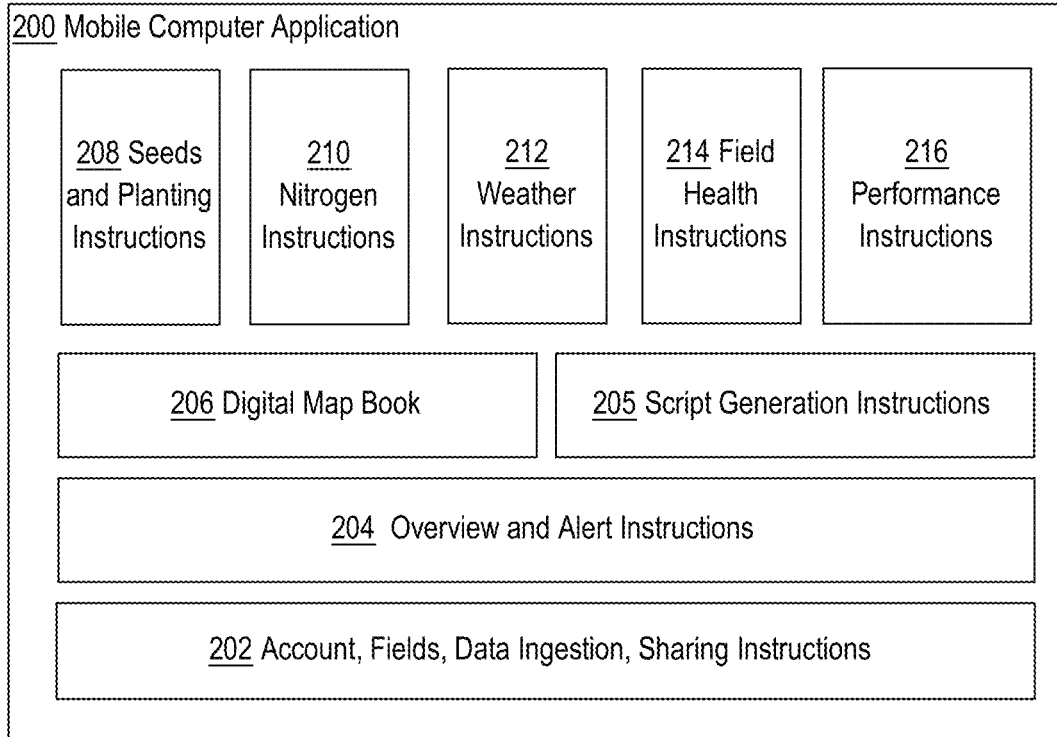
(b)
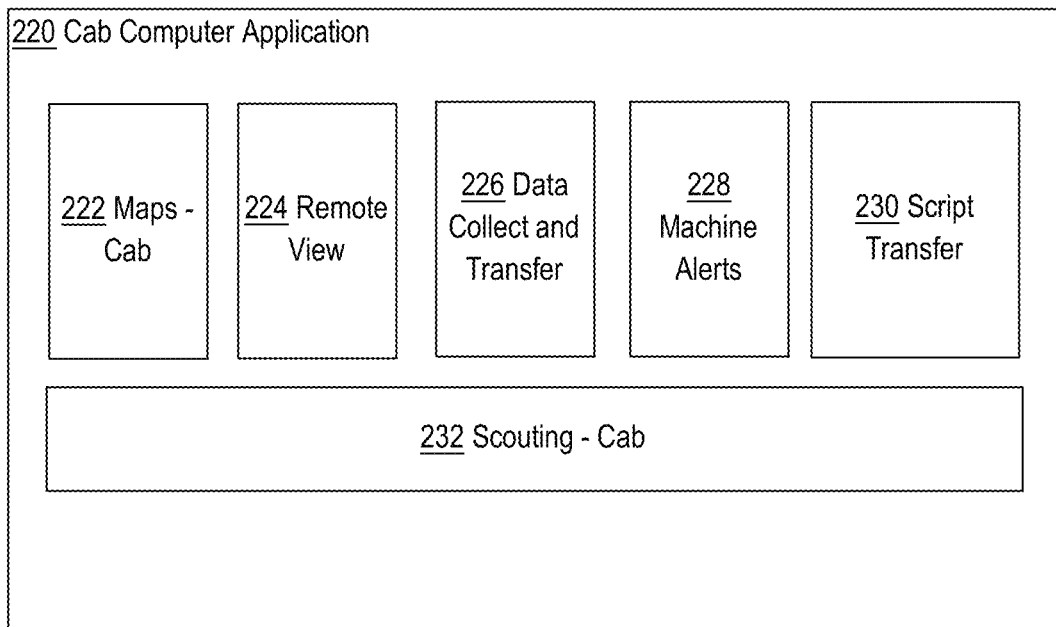

FIG. 6

| | CROP | PLANTED ACRES | PRODUCT | RELATIVE MATURITY | TARGET YIELD | POPULATION(AVG) | PLA |
|---|---|---|---|---|---|---|---|
| Ames, IA 1<br>Corn \| 100 \| Boone, IA | Corn | — | DMC82-M | 112 | 160 | 34000 | Apr |
| Austin, MN 1<br>Corn \| 100 \| Fredricks, MN | Corn | — | DMC82-M | 114 | 160 | 36000 | Apr |
| Boone, IN 1<br>Corn \| 100 \| Boone, IA | Corn | — | DMC82-M | 112 | 150 | 34000 | Apr |
| Champaign 1<br>Corn \| 100 \| Champaign, IL | Corn | — | — | 112 | 200 | 34000 | Apr |
| E Nebraska 1<br>Corn \| 100 \| Burt, NE | Corn | — | — | 112 | 160 | 34000 | Apr |

Data Manager

Nitrogen | Planting | Practices | Soil

Planting 1(4 Fields)
Crop Corn Product
Plant Date: 2016-04-12
ILU 112 \| Pop: 34000
Edit  Apply Planting 2(0 Fields)
Crop Corn Product
Plant Date: 2016-04-15
ILU 83 \| Pop: 34000
Edit  Apply Planting 3(0 Fields)
Crop Corn Product
Plant Date: 2016-04-13
ILU 83 \| Pop: 34000
Edit  Apply Planting 4(1 Fields)
Crop Corn Product
Plant Date: 2016-04-13
ILU 112 \| Pop: 34000
Edit  Apply + Add New Planting Plan Select All

DIGITAL NUTRIENT MODELS USING SPATIALLY DISTRIBUTED VALUES UNIQUE TO AN AGRONOMIC FIELD

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright or rights whatsoever. © 2017-2018 The Climate Corporation.

FIELD OF THE DISCLOSURE

The present disclosure relates to digital computer modeling of nutrients in a field, such as nitrogen, phosphorus, and potassium. Additionally, the present disclosure relates to computer processing techniques for generating spatial adaptations to digital nutrient models based on agronomic field specific data.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Nutrients are essential in the growth and development of crops. Crops absorb nutrients such as nitrogen, phosphorus, and potassium in the surrounding soil to facilitate crop growth. Different types of crops have different requirements for each nutrient. When a crop is unable to meet its nutrient needs, the crop suffers. For example, a lack of nitrogen may lead to destruction of a crop's leaves. Additionally, once the nitrogen concentration in a plant decreases below a critical threshold, photosynthesis and dry matter accumulation is negatively impacted. An end result is that the yield of a crop which does not receive enough nutrients is decreased.

Computer-implemented predictive models of agricultural crop fertility can be useful for computing optimal nutrient application rates. Often, these predictive models are generated using a large amount of experimental data or aggregated historical data from a large number of fields. These predictive models tend to generalize modeling of crop growth, treating each individual field as a sum of its inputs. For example, if two fields have the same soil type, same crop hybrid, same elevation, and same management structure, a computation of a required amount of nitrogen for each field to reach an ideal yield will be equivalent between the two fields.

One major problem with computer-implemented predictive models is that their ability to be agronomic field-specific is entirely based on the current year's inputs into the model. Thus, any underlying characteristic of the agronomic field that is not captured by the model will cause the model to consistently overestimate or underestimate nutrient requirements for a field.

To create a model that takes into account a specific field's idiosyncrasies would require massive amounts of data from each agronomic field. Such data is rarely available for agronomic fields that are not a site for agronomic experiments. Thus, an individual nutrient model for a specific field is often unfeasible and inefficient.

Additionally, in some cases, a digital fertility model may be biased for a particular field because of unmeasured, poorly measured, or unknown field properties on that field. In such cases, an individual nutrient model for a specific field will be unreliable or lead to inefficient outcomes.

Thus, there is a need for a system which can calibrate a nutrient model to a specific agronomic field using available historical data for the agronomic field.

SUMMARY

The appended claims may serve as a summary of the disclosure.

BRIEF DESCRIPTION OF THE DRAWINGS

In the drawings:

FIG. 2 illustrates two views of an example logical organization of sets of instructions in main memory when an example mobile application is loaded for execution.

FIG. 6 depicts an example embodiment of a spreadsheet view for data entry.

DETAILED DESCRIPTION

Figure 1:
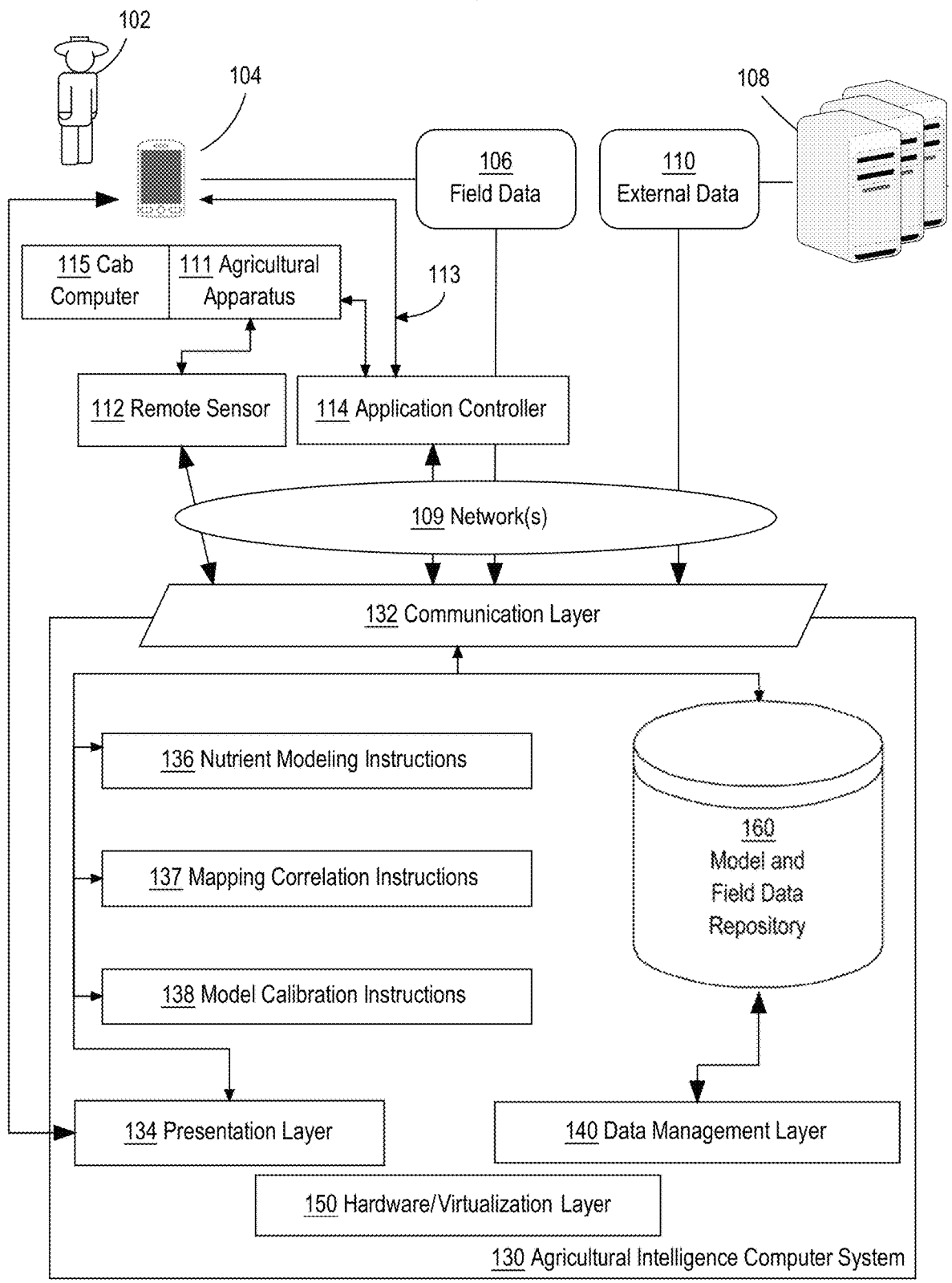
FIG. 1 illustrates an example computer system that is configured to perform the functions described herein, shown in a field environment with other apparatus with which the system may interoperate.

In the following description, for the purposes of explanation, numerous specific details are set forth in order to provide a thorough understanding of the present disclosure. It will be apparent, however, that embodiments may be practiced without these specific details. In other instances, well-known structures and devices are shown in block diagram form in order to avoid unnecessarily obscuring the present disclosure. Embodiments are disclosed in sections according to the following outline:

1. GENERAL OVERVIEW
2. EXAMPLE AGRICULTURAL INTELLIGENCE COMPUTER SYSTEM
   2.1. STRUCTURAL OVERVIEW
   2.2. APPLICATION PROGRAM OVERVIEW
   2.3. DATA INGEST TO THE COMPUTER SYSTEM
   2.4. PROCESS OVERVIEW—AGRONOMIC MODEL TRAINING
   2.5. IMPLEMENTATION EXAMPLE—HARDWARE OVERVIEW
3. NUTRIENT MODEL CORRECTION
   3.1. FUNCTIONAL OVERVIEW
   3.2. MODEL CORRELATIONS AND CORRECTIONS
   3.3. RESIDUAL MAP EMBODIMENTS
   3.4. ADDITIONAL MODEL CORRECTION USES
4. BENEFITS OF CERTAIN EMBODIMENTS
5. EXTENSIONS AND ALTERNATIVES

1. General Overview

Systems and methods for calibrating a nutrient model to a specific agronomic field are described herein. In an embodiment, an agricultural intelligence computer system stores a digital model of crop growth. The agricultural intelligence computer system uses historical input data for a particular agronomic field to compute a required nutrient application value for a plurality of locations on the agronomic field, the required nutrient application value indicating an amount of a nutrient that must be added to the agronomic field to generate the agronomic yield that the agronomic field received for the year corresponding to the inputs. The agricultural intelligence computer system computes residual values for each location where the required nutrient value is higher than an amount of nutrient that was actually applied to the agronomic field. The agricultural intelligence computer system compares a spatial mapping of the residual values to spatial mappings of other spatial characteristics of the agronomic field in order to create model correction data for calibrating the nutrient model to the specific agronomic field.

In an embodiment, a method comprises storing, in the computing system, a digital model of crop growth, the digital model of crop growth being configured to compute nutrient requirements in soil to produce particular yield values based, at least in part, on data unique to an agricultural field; receiving agronomic field data for a particular agronomic field, the agronomic field data comprising one or more input parameters for each of a plurality of locations on the agronomic field, nutrient application values for each of the plurality of locations, and measured yield values for each of the plurality of locations; using the digital model of crop growth computing, for each location of the plurality of locations, a required nutrient value indicating a required amount of nutrient to produce the measured yield values; identifying a subset of the plurality of locations where the computed required nutrient value is greater than the nutrient application value; computing, for each of the subset of the plurality of locations, a residual value comprising a difference between the required nutrient value and the nutrient application value; generating a residual map comprising the residual values at the subset of the plurality of locations; generating, from the residual map and the one or more input parameters for each of the plurality of locations, particular model correction data for the particular agronomic field; storing the particular model correction data with an identifier of the particular agronomic field.

2. Example Agricultural Intelligence Computer System

2.1 Structural Overview

FIG. 1 illustrates an example computer system that is configured to perform the functions described herein, shown in a field environment with other apparatus with which the system may interoperate. In one embodiment, a user 102 owns, operates or possesses a field manager computing device 104 in a field location or associated with a field location such as a field intended for agricultural activities or a management location for one or more agricultural fields. The field manager computer device 104 is programmed or configured to provide field data 106 to an agricultural intelligence computer system 130 via one or more networks 109.

Examples of field data 106 include (a) identification data (for example, acreage, field name, field identifiers, geographic identifiers, boundary identifiers, crop identifiers, and any other suitable data that may be used to identify farm land, such as a common land unit (CLU), lot and block number, a parcel number, geographic coordinates and boundaries, Farm Serial Number (FSN), farm number, tract number, field number, section, township, and/or range), (b) harvest data (for example, crop type, crop variety, crop rotation, whether the crop is grown organically, harvest date, Actual Production History (APH), expected yield, yield, crop price, crop revenue, grain moisture, tillage practice, and previous growing season information), (c) soil data (for example, type, composition, pH, organic matter (OM), cation exchange capacity (CEC)), (d) planting data (for example, planting date, seed(s) type, relative maturity (RM) of planted seed(s), seed population), (e) fertilizer data (for example, nutrient type (Nitrogen, Phosphorous, Potassium), application type, application date, amount, source, method), (f) chemical application data (for example, pesticide, herbicide, fungicide, other substance or mixture of substances intended for use as a plant regulator, defoliant, or desiccant, application date, amount, source, method), (g) irrigation data (for example, application date, amount, source, method), (h) weather data (for example, precipitation, rainfall rate, predicted rainfall, water runoff rate region, temperature, wind, forecast, pressure, visibility, clouds, heat index, dew point, humidity, snow depth, air quality, sunrise, sunset), (i) imagery data (for example, imagery and light spectrum information from an agricultural apparatus sensor, camera, computer, smartphone, tablet, unmanned aerial vehicle, planes or satellite), (j) scouting observations (photos, videos, free form notes, voice recordings, voice transcriptions, weather conditions (temperature, precipitation (current and over time), soil moisture, crop growth stage, wind velocity, relative humidity, dew point, black layer)), and (k) soil, seed, crop phenology, pest and disease reporting, and predictions sources and databases.

A data server computer 108 is communicatively coupled to agricultural intelligence computer system 130 and is programmed or configured to send external data 110 to agricultural intelligence computer system 130 via the network(s) 109. The external data server computer 108 may be owned or operated by the same legal person or entity as the agricultural intelligence computer system 130, or by a different person or entity such as a government agency, non-governmental organization (NGO), and/or a private data service provider. Examples of external data include weather data, imagery data, soil data, or statistical data relating to crop growths, among others. External data 110 may consist of the same type of information as field data 106. In some embodiments, the external data 110 is provided by an external data server 108 owned by the same entity that owns and/or operates the agricultural intelligence computer system 130. For example, the agricultural intelligence computer system 130 may include a data server focused exclusively on a type of data that might otherwise be obtained from third party sources, such as weather data. In some embodiments, an external data server 108 may actually be incorporated within the system 130.

An agricultural apparatus 111 may have one or more remote sensors 112 fixed thereon, which sensors are communicatively coupled either directly or indirectly via agricultural apparatus 111 to the agricultural intelligence computer system 130 and are programmed or configured to send sensor data to agricultural intelligence computer system 130. Examples of agricultural apparatus 111 include tractors, combines, harvesters, planters, trucks, fertilizer equipment, aerial vehicles including unmanned aerial vehicles, and any other item of physical machinery or hardware, typically mobile machinery, and which may be used in tasks associated with agriculture. In some embodiments, a single unit of apparatus 111 may comprise a plurality of sensors 112 that are coupled locally in a network on the apparatus; controller area network (CAN) is example of such a network that can be installed in combines, harvesters, sprayers, and cultivators. Application controller 114 is communicatively coupled to agricultural intelligence computer system 130 via the network(s) 109 and is programmed or configured to receive one or more scripts that are used to control an operating parameter of an agricultural vehicle or implement from the agricultural intelligence computer system 130. For instance, a controller area network (CAN) bus interface may be used to enable communications from the agricultural intelligence computer system 130 to the agricultural apparatus 111, such as how the CLIMATE FIELDVIEW DRIVE, available from The Climate Corporation, San Francisco, Calif., is used. Sensor data may consist of the same type of information as field data 106. In some embodiments, remote sensors 112 may not be fixed to an agricultural apparatus 111 but may be remotely located in the field and may communicate with network 109.

The apparatus 111 may comprise a cab computer 115 that is programmed with a cab application, which may comprise a version or variant of the mobile application for device 104 that is further described in other sections herein. In an embodiment, cab computer 115 comprises a compact computer, often a tablet-sized computer or smartphone, with a graphical screen display, such as a color display, that is mounted within an operator's cab of the apparatus 111. Cab computer 115 may implement some or all of the operations and functions that are described further herein for the mobile computer device 104.

The network(s) 109 broadly represent any combination of one or more data communication networks including local area networks, wide area networks, internetworks or internets, using any of wireline or wireless links, including terrestrial or satellite links. The network(s) may be implemented by any medium or mechanism that provides for the exchange of data between the various elements of FIG. 1. The various elements of FIG. 1 may also have direct (wired or wireless) communications links. The sensors 112, controller 114, external data server computer 108, and other elements of the system each comprise an interface compatible with the network(s) 109 and are programmed or configured to use standardized protocols for communication across the networks such as TCP/IP, Bluetooth, CAN protocol and higher-layer protocols such as HTTP, TLS, and the like.

Agricultural intelligence computer system 130 is programmed or configured to receive field data 106 from field manager computing device 104, external data 110 from external data server computer 108, and sensor data from remote sensor 112. Agricultural intelligence computer system 130 may be further configured to host, use or execute one or more computer programs, other software elements, digitally programmed logic such as FPGAs or ASICs, or any combination thereof to perform translation and storage of data values, construction of digital models of one or more crops on one or more fields, generation of recommendations and notifications, and generation and sending of scripts to application controller 114, in the manner described further in other sections of this disclosure.

In an embodiment, agricultural intelligence computer system 130 is programmed with or comprises a communication layer 132, presentation layer 134, data management layer 140, hardware/virtualization layer 150, and model and field data repository 160. "Layer," in this context, refers to any combination of electronic digital interface circuits, microcontrollers, firmware such as drivers, and/or computer programs or other software elements.

Communication layer 132 may be programmed or configured to perform input/output interfacing functions including sending requests to field manager computing device 104, external data server computer 108, and remote sensor 112 for field data, external data, and sensor data respectively. Communication layer 132 may be programmed or configured to send the received data to model and field data repository 160 to be stored as field data 106.

Presentation layer 134 may be programmed or configured to generate a graphical user interface (GUI) to be displayed on field manager computing device 104, cab computer 115 or other computers that are coupled to the system 130 through the network 109. The GUI may comprise controls for inputting data to be sent to agricultural intelligence computer system 130, generating requests for models and/or recommendations, and/or displaying recommendations, notifications, models, and other field data.

Data management layer 140 may be programmed or configured to manage read operations and write operations involving the repository 160 and other functional elements of the system, including queries and result sets communicated between the functional elements of the system and the repository. Examples of data management layer 140 include JDBC, SQL server interface code, and/or HADOOP interface code, among others. Repository 160 may comprise a database. As used herein, the term "database" may refer to either a body of data, a relational database management system (RDBMS), or to both. As used herein, a database may comprise any collection of data including hierarchical databases, relational databases, flat file databases, object-relational databases, object oriented databases, distributed databases, and any other structured collection of records or data that is stored in a computer system. Examples of RDBMS's include, but are not limited to including, ORACLE®, MYSQL, IBM® DB2, MICROSOFT® SQL SERVER, SYBASE®, and POSTGRESQL databases. However, any database may be used that enables the systems and methods described herein.

When field data 106 is not provided directly to the agricultural intelligence computer system via one or more agricultural machines or agricultural machine devices that interacts with the agricultural intelligence computer system, the user may be prompted via one or more user interfaces on the user device (served by the agricultural intelligence computer system) to input such information. In an example embodiment, the user may specify identification data by accessing a map on the user device (served by the agricultural intelligence computer system) and selecting specific CLUs that have been graphically shown on the map. In an alternative embodiment, the user 102 may specify identification data by accessing a map on the user device (served by the agricultural intelligence computer system 130) and drawing boundaries of the field over the map. Such CLU selection or map drawings represent geographic identifiers. In alternative embodiments, the user may specify identification data by accessing field identification data (provided as shape files or in a similar format) from the U. S. Department of Agriculture Farm Service Agency or other source via the user device and providing such field identification data to the agricultural intelligence computer system.

In an example embodiment, the agricultural intelligence computer system 130 is programmed to generate and cause displaying a graphical user interface comprising a data manager for data input. After one or more fields have been identified using the methods described above, the data manager may provide one or more graphical user interface widgets which when selected can identify changes to the field, soil, crops, tillage, or nutrient practices. The data manager may include a timeline view, a spreadsheet view, and/or one or more editable programs.

Figure 5:
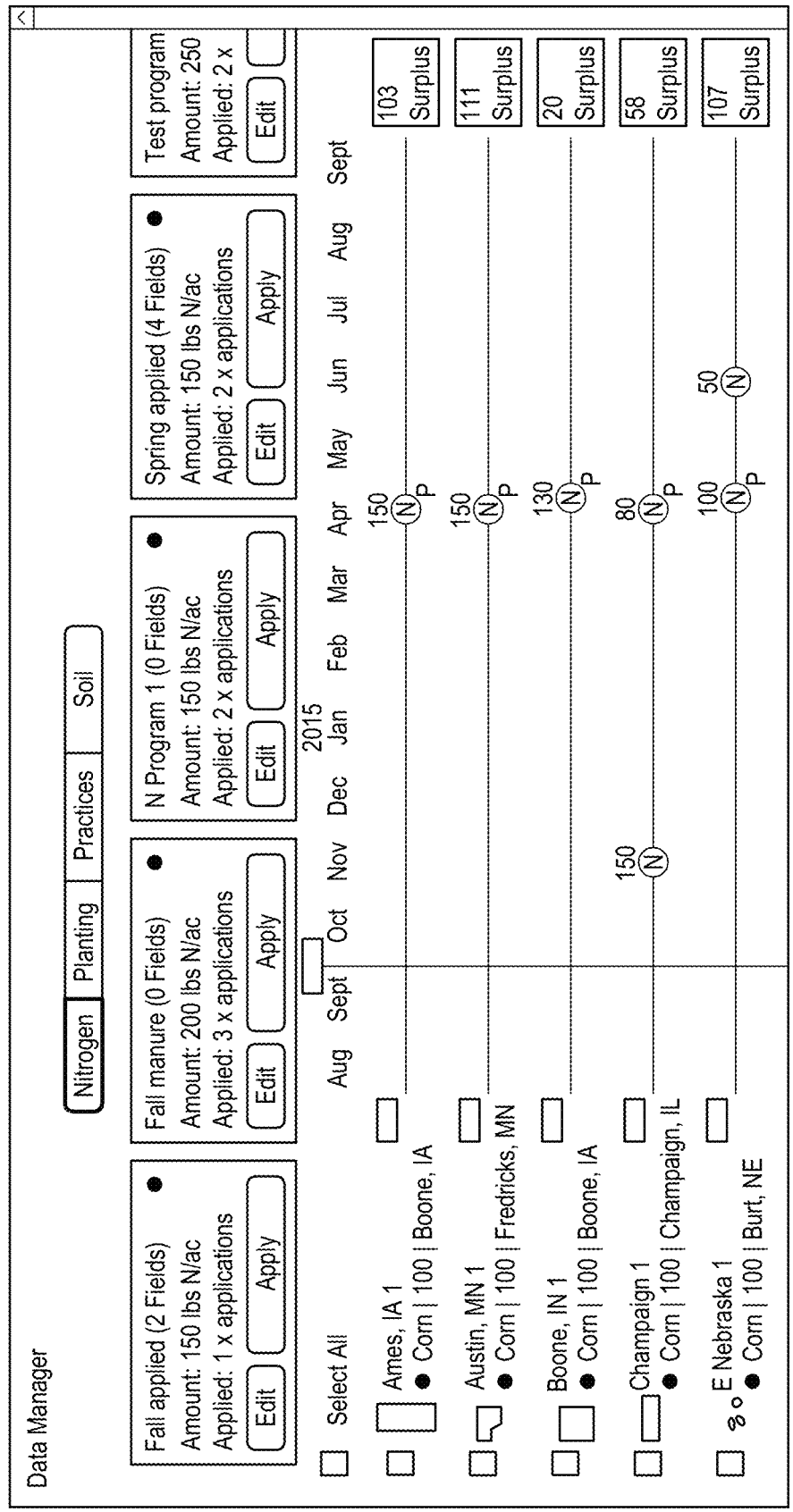
FIG. 5 depicts an example embodiment of a timeline view for data entry.

FIG. 5 depicts an example embodiment of a timeline view for data entry. Using the display depicted in FIG. 5, a user computer can input a selection of a particular field and a particular date for the addition of event. Events depicted at the top of the timeline may include Nitrogen, Planting, Practices, and Soil. To add a nitrogen application event, a user computer may provide input to select the nitrogen tab. The user computer may then select a location on the timeline for a particular field in order to indicate an application of nitrogen on the selected field. In response to receiving a selection of a location on the timeline for a particular field, the data manager may display a data entry overlay, allowing the user computer to input data pertaining to nitrogen applications, planting procedures, soil application, tillage procedures, irrigation practices, or other information relating to the particular field. For example, if a user computer selects a portion of the timeline and indicates an application of nitrogen, then the data entry overlay may include fields for inputting an amount of nitrogen applied, a date of application, a type of fertilizer used, and any other information related to the application of nitrogen.

In an embodiment, the data manager provides an interface for creating one or more programs. "Program," in this context, refers to a set of data pertaining to nitrogen applications, planting procedures, soil application, tillage procedures, irrigation practices, or other information that may be related to one or more fields, and that can be stored in digital data storage for reuse as a set in other operations. After a program has been created, it may be conceptually applied to one or more fields and references to the program may be stored in digital storage in association with data identifying the fields. Thus, instead of manually entering identical data relating to the same nitrogen applications for multiple different fields, a user computer may create a program that indicates a particular application of nitrogen and then apply the program to multiple different fields. For example, in the timeline view of FIG. 5, the top two timelines have the "Spring applied" program selected, which includes an application of 150 lbs N/ac in early April. The data manager may provide an interface for editing a program. In an embodiment, when a particular program is edited, each field that has selected the particular program is edited. For example, in FIG. 5, if the "Spring applied" program is edited to reduce the application of nitrogen to 130 lbs N/ac, the top two fields may be updated with a reduced application of nitrogen based on the edited program.

In an embodiment, in response to receiving edits to a field that has a program selected, the data manager removes the correspondence of the field to the selected program. For example, if a nitrogen application is added to the top field in FIG. 5, the interface may update to indicate that the "Spring applied" program is no longer being applied to the top field. While the nitrogen application in early April may remain, updates to the "Spring applied" program would not alter the April application of nitrogen.

FIG. 6 depicts an example embodiment of a spreadsheet view for data entry. Using the display depicted in FIG. 6, a user can create and edit information for one or more fields. The data manager may include spreadsheets for inputting information with respect to Nitrogen, Planting, Practices, and Soil as depicted in FIG. 6. To edit a particular entry, a user computer may select the particular entry in the spreadsheet and update the values. For example, FIG. 6 depicts an in-progress update to a target yield value for the second field. Additionally, a user computer may select one or more fields in order to apply one or more programs. In response to receiving a selection of a program for a particular field, the data manager may automatically complete the entries for the particular field based on the selected program. As with the timeline view, the data manager may update the entries for each field associated with a particular program in response to receiving an update to the program. Additionally, the data manager may remove the correspondence of the selected program to the field in response to receiving an edit to one of the entries for the field.

In an embodiment, model and field data is stored in model and field data repository 160. Model data comprises data models created for one or more fields. For example, a crop model may include a digitally constructed model of the development of a crop on the one or more fields. "Model," in this context, refers to an electronic digitally stored set of executable instructions and data values, associated with one another, which are capable of receiving and responding to a programmatic or other digital call, invocation, or request for resolution based upon specified input values, to yield one or more stored or calculated output values that can serve as the basis of computer-implemented recommendations, output data displays, or machine control, among other things. Persons of skill in the field find it convenient to express models using mathematical equations, but that form of expression does not confine the models disclosed herein to abstract concepts; instead, each model herein has a practical application in a computer in the form of stored executable instructions and data that implement the model using the computer. The model may include a model of past events on the one or more fields, a model of the current status of the one or more fields, and/or a model of predicted events on the one or more fields. Model and field data may be stored in data structures in memory, rows in a database table, in flat files or spreadsheets, or other forms of stored digital data.

In an embodiment, each of nutrient modeling instructions 136, mapping correlation instructions 137, and model calibration instructions 138 comprises a set of one or more pages of main memory, such as RAM, in the agricultural intelligence computer system 130 into which executable instructions have been loaded and which when executed cause the agricultural intelligence computing system to perform the functions or operations that are described herein with reference to those modules. For example, the nutrient modeling instructions 136 may comprise a set of pages in RAM that contain instructions which when executed cause performing the nutrient modeling functions that are described herein. The instructions may be in machine executable code in the instruction set of a CPU and may have been compiled based upon source code written in JAVA, C, C++, OBJECTIVE-C, or any other human-readable programming language or environment, alone or in combination with scripts in JAVASCRIPT, other scripting languages and other programming source text. The term "pages" is intended to refer broadly to any region within main memory and the specific terminology used in a system may vary depending on the memory architecture or processor architecture. In another embodiment, each of nutrient modeling instructions 136, mapping correlation instructions 137, and model calibration instructions 138 also may represent one or more files or projects of source code that are digitally stored in a mass storage device such as non-volatile RAM or disk storage, in the agricultural intelligence computer system 130 or a separate repository system, which when compiled or interpreted cause generating executable instructions which when executed cause the agricultural intelligence computing system to perform the functions or operations that are described herein with reference to those modules. In other words, the drawing figure may represent the manner in which programmers or software developers organize and arrange source code for later compilation into an executable, or interpretation into bytecode or the equivalent, for execution by the agricultural intelligence computer system 130.

Nutrient modeling instructions 136 comprise instructions which, when executed by one or more processors, cause a computing system to compute nutrient requirements based on one or more input values for an agronomic field and one or more stored algorithms that model crop growth. Mapping correlation instructions 137 comprise instructions which, when executed by one or more processors, cause a computing system to compute residual values for a plurality of locations on an agronomic field, generate a spatial map of the residual values, and correlate the spatial map of residual values to spatial maps of other input values on the agronomic field. Model calibration instructions 138 comprise instructions which, when executed by one or more processors, cause a computing system to generate model correction data for a particular agronomic field using the residual maps and the correlated spatial maps of input values on the agronomic field.

Figure 4:
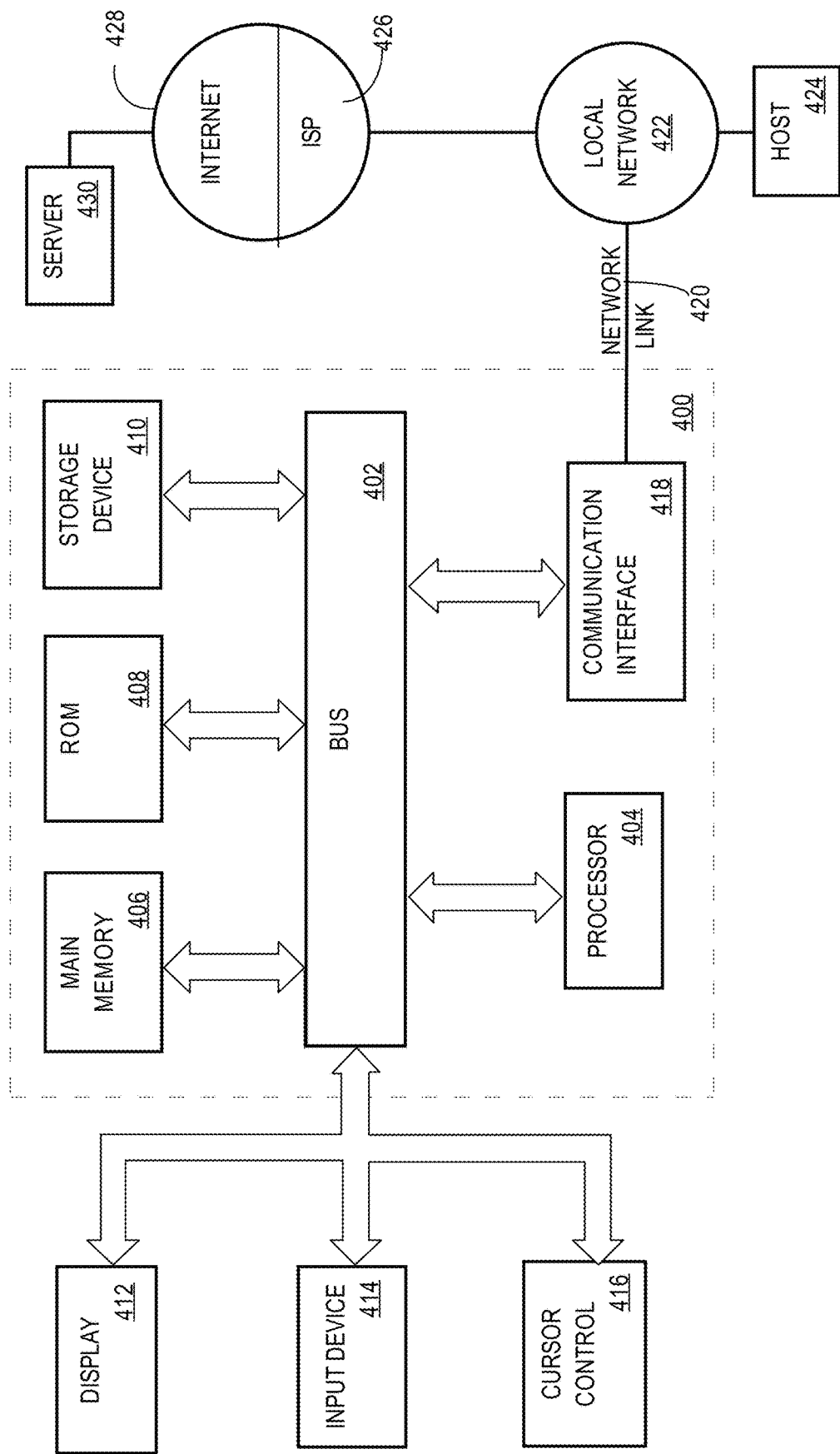
FIG. 4 is a block diagram that illustrates a computer system upon which an embodiment of the invention may be implemented.

Hardware/virtualization layer 150 comprises one or more central processing units (CPUs), memory controllers, and other devices, components, or elements of a computer system such as volatile or non-volatile memory, non-volatile storage such as disk, and I/O devices or interfaces as illustrated and described, for example, in connection with FIG. 4. The layer 150 also may comprise programmed instructions that are configured to support virtualization, containerization, or other technologies.

For purposes of illustrating a clear example, FIG. 1 shows a limited number of instances of certain functional elements. However, in other embodiments, there may be any number of such elements. For example, embodiments may use thousands or millions of different mobile computing devices 104 associated with different users. Further, the system 130 and/or external data server computer 108 may be implemented using two or more processors, cores, clusters, or instances of physical machines or virtual machines, configured in a discrete location or co-located with other elements in a datacenter, shared computing facility or cloud computing facility.

2.2. Application Program Overview

In an embodiment, the implementation of the functions described herein using one or more computer programs or other software elements that are loaded into and executed using one or more general-purpose computers will cause the general-purpose computers to be configured as a particular machine or as a computer that is specially adapted to perform the functions described herein. Further, each of the flow diagrams that are described further herein may serve, alone or in combination with the descriptions of processes and functions in prose herein, as algorithms, plans or directions that may be used to program a computer or logic to implement the functions that are described. In other words, all the prose text herein, and all the drawing figures, together are intended to provide disclosure of algorithms, plans or directions that are sufficient to permit a skilled person to program a computer to perform the functions that are described herein, in combination with the skill and knowledge of such a person given the level of skill that is appropriate for inventions and disclosures of this type.

In an embodiment, user 102 interacts with agricultural intelligence computer system 130 using field manager computing device 104 configured with an operating system and one or more application programs or apps; the field manager computing device 104 also may interoperate with the agricultural intelligence computer system independently and automatically under program control or logical control and direct user interaction is not always required. Field manager computing device 104 broadly represents one or more of a smart phone, PDA, tablet computing device, laptop computer, desktop computer, workstation, or any other computing device capable of transmitting and receiving information and performing the functions described herein. Field manager computing device 104 may communicate via a network using a mobile application stored on field manager computing device 104, and in some embodiments, the device may be coupled using a cable 113 or connector to the sensor 112 and/or controller 114. A particular user 102 may own, operate or possess and use, in connection with system 130, more than one field manager computing device 104 at a time.

The mobile application may provide client-side functionality, via the network to one or more mobile computing devices. In an example embodiment, field manager computing device 104 may access the mobile application via a web browser or a local client application or app. Field manager computing device 104 may transmit data to, and receive data from, one or more front-end servers, using web-based protocols or formats such as HTTP, XML and/or JSON, or app-specific protocols. In an example embodiment, the data may take the form of requests and user information input, such as field data, into the mobile computing device. In some embodiments, the mobile application interacts with location tracking hardware and software on field manager computing device 104 which determines the location of field manager computing device 104 using standard tracking techniques such as multilateration of radio signals, the global positioning system (GPS), WiFi positioning systems, or other methods of mobile positioning. In some cases, location data or other data associated with the device 104, user 102, and/or user account(s) may be obtained by queries to an operating system of the device or by requesting an app on the device to obtain data from the operating system.

In an embodiment, field manager computing device 104 sends field data 106 to agricultural intelligence computer system 130 comprising or including, but not limited to, data values representing one or more of: a geographical location of the one or more fields, tillage information for the one or more fields, crops planted in the one or more fields, and soil data extracted from the one or more fields. Field manager computing device 104 may send field data 106 in response to user input from user 102 specifying the data values for the one or more fields. Additionally, field manager computing device 104 may automatically send field data 106 when one or more of the data values becomes available to field manager computing device 104. For example, field manager computing device 104 may be communicatively coupled to remote sensor 112 and/or application controller 114 which include an irrigation sensor and/or irrigation controller. In response to receiving data indicating that application controller 114 released water onto the one or more fields, field manager computing device 104 may send field data 106 to agricultural intelligence computer system 130 indicating that water was released on the one or more fields. Field data 106 identified in this disclosure may be input and communicated using electronic digital data that is communicated between computing devices using parameterized URLs over HTTP, or another suitable communication or messaging protocol.

A commercial example of the mobile application is CLIMATE FIELDVIEW, commercially available from The Climate Corporation, San Francisco, California. The CLIMATE FIELDVIEW application, or other applications, may be modified, extended, or adapted to include features, functions, and programming that have not been disclosed earlier than the filing date of this disclosure. In one embodiment, the mobile application comprises an integrated software platform that allows a grower to make fact-based decisions for their operation because it combines historical data about the grower's fields with any other data that the grower wishes to compare. The combinations and comparisons may be performed in real time and are based upon scientific models that provide potential scenarios to permit the grower to make better, more informed decisions.

FIG. 2 illustrates two views of an example logical organization of sets of instructions in main memory when an example mobile application is loaded for execution. In FIG. 2, each named element represents a region of one or more pages of RAM or other main memory, or one or more blocks of disk storage or other non-volatile storage, and the programmed instructions within those regions. In one embodiment, in view (a), a mobile computer application 200 comprises account-fields-data ingestion-sharing instructions 202, overview and alert instructions 204, digital map book instructions 206, seeds and planting instructions 208, nitrogen instructions 210, weather instructions 212, field health instructions 214, and performance instructions 216.

In one embodiment, a mobile computer application 200 comprises account, fields, data ingestion, sharing instructions 202 which are programmed to receive, translate, and ingest field data from third party systems via manual upload or APIs. Data types may include field boundaries, yield maps, as-planted maps, soil test results, as-applied maps, and/or management zones, among others. Data formats may include shape files, native data formats of third parties, and/or farm management information system (FMIS) exports, among others. Receiving data may occur via manual upload, e-mail with attachment, external APIs that push data to the mobile application, or instructions that call APIs of external systems to pull data into the mobile application. In one embodiment, mobile computer application 200 comprises a data inbox. In response to receiving a selection of the data inbox, the mobile computer application 200 may display a graphical user interface for manually uploading data files and importing uploaded files to a data manager.

In one embodiment, digital map book instructions 206 comprise field map data layers stored in device memory and are programmed with data visualization tools and geospatial field notes. This provides growers with convenient information close at hand for reference, logging and visual insights into field performance. In one embodiment, overview and alert instructions 204 are programmed to provide an operation-wide view of what is important to the grower, and timely recommendations to take action or focus on particular issues. This permits the grower to focus time on what needs attention, to save time and preserve yield throughout the season. In one embodiment, seeds and planting instructions 208 are programmed to provide tools for seed selection, hybrid placement, and script creation, including variable rate (VR) script creation, based upon scientific models and empirical data. This enables growers to maximize yield or return on investment through optimized seed purchase, placement and population.

In one embodiment, script generation instructions 205 are programmed to provide an interface for generating scripts, including variable rate (VR) fertility scripts. The interface enables growers to create scripts for field implements, such as nutrient applications, planting, and irrigation. For example, a planting script interface may comprise tools for identifying a type of seed for planting. Upon receiving a selection of the seed type, mobile computer application 200 may display one or more fields broken into management zones, such as the field map data layers created as part of digital map book instructions 206. In one embodiment, the management zones comprise soil zones along with a panel identifying each soil zone and a soil name, texture, drainage for each zone, or other field data. Mobile computer application 200 may also display tools for editing or creating such, such as graphical tools for drawing management zones, such as soil zones, over a map of one or more fields. Planting procedures may be applied to all management zones or different planting procedures may be applied to different subsets of management zones. When a script is created, mobile computer application 200 may make the script available for download in a format readable by an application controller, such as an archived or compressed format. Additionally, and/or alternatively, a script may be sent directly to cab computer 115 from mobile computer application 200 and/or uploaded to one or more data servers and stored for further use.

In one embodiment, nitrogen instructions 210 are programmed to provide tools to inform nitrogen decisions by visualizing the availability of nitrogen to crops. This enables growers to maximize yield or return on investment through optimized nitrogen application during the season. Example programmed functions include displaying images such as SSURGO images to enable drawing of fertilizer application zones and/or images generated from subfield soil data, such as data obtained from sensors, at a high spatial resolution (as fine as millimeters or smaller depending on sensor proximity and resolution); upload of existing grower-defined zones; providing a graph of plant nutrient availability and/or a map to enable tuning application(s) of nitrogen across multiple zones; output of scripts to drive machinery; tools for mass data entry and adjustment; and/or maps for data visualization, among others. "Mass data entry," in this context, may mean entering data once and then applying the same data to multiple fields and/or zones that have been defined in the system; example data may include nitrogen application data that is the same for many fields and/or zones of the same grower, but such mass data entry applies to the entry of any type of field data into the mobile computer application 200. For example, nitrogen instructions 210 may be programmed to accept definitions of nitrogen application and practices programs and to accept user input specifying to apply those programs across multiple fields. "Nitrogen application programs," in this context, refers to stored, named sets of data that associates: a name, color code or other identifier, one or more dates of application, types of material or product for each of the dates and amounts, method of application or incorporation such as injected or broadcast, and/or amounts or rates of application for each of the dates, crop or hybrid that is the subject of the application, among others. "Nitrogen practices programs," in this context, refer to stored, named sets of data that associates: a practices name; a previous crop; a tillage system; a date of primarily tillage; one or more previous tillage systems that were used; one or more indicators of application type, such as manure, that were used. Nitrogen instructions 210 also may be programmed to generate and cause displaying a nitrogen graph, which indicates projections of plant use of the specified nitrogen and whether a surplus or shortfall is predicted; in some embodiments, different color indicators may signal a magnitude of surplus or magnitude of shortfall. In one embodiment, a nitrogen graph comprises a graphical display in a computer display device comprising a plurality of rows, each row associated with and identifying a field; data specifying what crop is planted in the field, the field size, the field location, and a graphic representation of the field perimeter; in each row, a timeline by month with graphic indicators specifying each nitrogen application and amount at points correlated to month names; and numeric and/or colored indicators of surplus or shortfall, in which color indicates magnitude.

In one embodiment, the nitrogen graph may include one or more user input features, such as dials or slider bars, to dynamically change the nitrogen planting and practices programs so that a user may optimize his nitrogen graph. The user may then use his optimized nitrogen graph and the related nitrogen planting and practices programs to implement one or more scripts, including variable rate (VR) fertility scripts. Nitrogen instructions 210 also may be programmed to generate and cause displaying a nitrogen map, which indicates projections of plant use of the specified nitrogen and whether a surplus or shortfall is predicted; in some embodiments, different color indicators may signal a magnitude of surplus or magnitude of shortfall. The nitrogen map may display projections of plant use of the specified nitrogen and whether a surplus or shortfall is predicted for different times in the past and the future (such as daily, weekly, monthly or yearly) using numeric and/or colored indicators of surplus or shortfall, in which color indicates magnitude. In one embodiment, the nitrogen map may include one or more user input features, such as dials or slider bars, to dynamically change the nitrogen planting and practices programs so that a user may optimize his nitrogen map, such as to obtain a preferred amount of surplus to shortfall. The user may then use his optimized nitrogen map and the related nitrogen planting and practices programs to implement one or more scripts, including variable rate (VR) fertility scripts. In other embodiments, similar instructions to the nitrogen instructions 210 could be used for application of other nutrients (such as phosphorus and potassium), application of pesticide, and irrigation programs.

In one embodiment, weather instructions 212 are programmed to provide field-specific recent weather data and forecasted weather information. This enables growers to save time and have an efficient integrated display with respect to daily operational decisions.

In one embodiment, field health instructions 214 are programmed to provide timely remote sensing images highlighting in-season crop variation and potential concerns. Example programmed functions include cloud checking, to identify possible clouds or cloud shadows; determining nitrogen indices based on field images; graphical visualization of scouting layers, including, for example, those related to field health, and viewing and/or sharing of scouting notes; and/or downloading satellite images from multiple sources and prioritizing the images for the grower, among others.

In one embodiment, performance instructions 216 are programmed to provide reports, analysis, and insight tools using on-farm data for evaluation, insights and decisions. This enables the grower to seek improved outcomes for the next year through fact-based conclusions about why return on investment was at prior levels, and insight into yield-limiting factors. The performance instructions 216 may be programmed to communicate via the network(s) 109 to back-end analytics programs executed at agricultural intelligence computer system 130 and/or external data server computer 108 and configured to analyze metrics such as yield, yield differential, hybrid, population, SSURGO zone, soil test properties, or elevation, among others. Programmed reports and analysis may include yield variability analysis, treatment effect estimation, benchmarking of yield and other metrics against other growers based on anonymized data collected from many growers, or data for seeds and planting, among others.

Applications having instructions configured in this way may be implemented for different computing device platforms while retaining the same general user interface appearance. For example, the mobile application may be programmed for execution on tablets, smartphones, or server computers that are accessed using browsers at client computers. Further, the mobile application as configured for tablet computers or smartphones may provide a full app experience or a cab app experience that is suitable for the display and processing capabilities of cab computer 115. For example, referring now to view (b) of FIG. 2, in one embodiment a cab computer application 220 may comprise maps-cab instructions 222, remote view instructions 224, data collect and transfer instructions 226, machine alerts instructions 228, script transfer instructions 230, and scouting-cab instructions 232. The code base for the instructions of view (b) may be the same as for view (a) and executables implementing the code may be programmed to detect the type of platform on which they are executing and to expose, through a graphical user interface, only those functions that are appropriate to a cab platform or full platform. This approach enables the system to recognize the distinctly different user experience that is appropriate for an in-cab environment and the different technology environment of the cab. The maps-cab instructions 222 may be programmed to provide map views of fields, farms or regions that are useful in directing machine operation. The remote view instructions 224 may be programmed to turn on, manage, and provide views of machine activity in real-time or near real-time to other computing devices connected to the system 130 via wireless networks, wired connectors or adapters, and the like. The data collect and transfer instructions 226 may be programmed to turn on, manage, and provide transfer of data collected at sensors and controllers to the system 130 via wireless networks, wired connectors or adapters, and the like. The machine alerts instructions 228 may be programmed to detect issues with operations of the machine or tools that are associated with the cab and generate operator alerts. The script transfer instructions 230 may be configured to transfer in scripts of instructions that are configured to direct machine operations or the collection of data. The scouting-cab instructions 232 may be programmed to display location-based alerts and information received from the system 130 based on the location of the field manager computing device 104, agricultural apparatus 111, or sensors 112 in the field and ingest, manage, and provide transfer of location-based scouting observations to the system 130 based on the location of the agricultural apparatus 111 or sensors 112 in the field.

2.3. Data Ingest to the Computer System

In an embodiment, external data server computer 108 stores external data 110, including soil data representing soil composition for the one or more fields and weather data representing temperature and precipitation on the one or more fields. The weather data may include past and present weather data as well as forecasts for future weather data. In an embodiment, external data server computer 108 comprises a plurality of servers hosted by different entities. For example, a first server may contain soil composition data while a second server may include weather data. Additionally, soil composition data may be stored in multiple servers. For example, one server may store data representing percentage of sand, silt, and clay in the soil while a second server may store data representing percentage of organic matter (OM) in the soil.

In an embodiment, remote sensor 112 comprises one or more sensors that are programmed or configured to produce one or more observations. Remote sensor 112 may be aerial sensors, such as satellites, vehicle sensors, planting equipment sensors, tillage sensors, fertilizer or insecticide application sensors, harvester sensors, and any other implement capable of receiving data from the one or more fields. In an embodiment, application controller 114 is programmed or configured to receive instructions from agricultural intelligence computer system 130. Application controller 114 may also be programmed or configured to control an operating parameter of an agricultural vehicle or implement. For example, an application controller may be programmed or configured to control an operating parameter of a vehicle, such as a tractor, planting equipment, tillage equipment, fertilizer or insecticide equipment, harvester equipment, or other farm implements such as a water valve. Other embodiments may use any combination of sensors and controllers, of which the following are merely selected examples.

The system 130 may obtain or ingest data under user 102 control, on a mass basis from a large number of growers who have contributed data to a shared database system. This form of obtaining data may be termed "manual data ingest" as one or more user-controlled computer operations are requested or triggered to obtain data for use by the system 130. As an example, the CLIMATE FIELDVIEW application, commercially available from The Climate Corporation, San Francisco, California, may be operated to export data to system 130 for storing in the repository 160.

For example, seed monitor systems can both control planter apparatus components and obtain planting data, including signals from seed sensors via a signal harness that comprises a CAN backbone and point-to-point connections for registration and/or diagnostics. Seed monitor systems can be programmed or configured to display seed spacing, population and other information to the user via the cab computer 115 or other devices within the system 130. Examples are disclosed in U.S. Pat. No. 8,738,243 and US Pat. Pub. 20150094916, and the present disclosure assumes knowledge of those other patent disclosures.

Likewise, yield monitor systems may contain yield sensors for harvester apparatus that send yield measurement data to the cab computer 115 or other devices within the system 130. Yield monitor systems may utilize one or more remote sensors 112 to obtain grain moisture measurements in a combine or other harvester and transmit these measurements to the user via the cab computer 115 or other devices within the system 130.

In an embodiment, examples of sensors 112 that may be used with any moving vehicle or apparatus of the type described elsewhere herein include kinematic sensors and position sensors. Kinematic sensors may comprise any of speed sensors such as radar or wheel speed sensors, accelerometers, or gyros. Position sensors may comprise GPS receivers or transceivers, or WiFi-based position or mapping apps that are programmed to determine location based upon nearby WiFi hotspots, among others.

In an embodiment, examples of sensors 112 that may be used with tractors or other moving vehicles include engine speed sensors, fuel consumption sensors, area counters or distance counters that interact with GPS or radar signals, PTO (power take-off) speed sensors, tractor hydraulics sensors configured to detect hydraulics parameters such as pressure or flow, and/or and hydraulic pump speed, wheel speed sensors or wheel slippage sensors. In an embodiment, examples of controllers 114 that may be used with tractors include hydraulic directional controllers, pressure controllers, and/or flow controllers; hydraulic pump speed controllers; speed controllers or governors; hitch position controllers; or wheel position controllers provide automatic steering.

In an embodiment, examples of sensors 112 that may be used with seed planting equipment such as planters, drills, or air seeders include seed sensors, which may be optical, electromagnetic, or impact sensors; downforce sensors such as load pins, load cells, pressure sensors; soil property sensors such as reflectivity sensors, moisture sensors, electrical conductivity sensors, optical residue sensors, or temperature sensors; component operating criteria sensors such as planting depth sensors, downforce cylinder pressure sensors, seed disc speed sensors, seed drive motor encoders, seed conveyor system speed sensors, or vacuum level sensors; or pesticide application sensors such as optical or other electromagnetic sensors, or impact sensors. In an embodiment, examples of controllers 114 that may be used with such seed planting equipment include: toolbar fold controllers, such as controllers for valves associated with hydraulic cylinders; downforce controllers, such as controllers for valves associated with pneumatic cylinders, airbags, or hydraulic cylinders, and programmed for applying downforce to individual row units or an entire planter frame; planting depth controllers, such as linear actuators; metering controllers, such as electric seed meter drive motors, hydraulic seed meter drive motors, or swath control clutches; hybrid selection controllers, such as seed meter drive motors, or other actuators programmed for selectively allowing or preventing seed or an air-seed mixture from delivering seed to or from seed meters or central bulk hoppers; metering controllers, such as electric seed meter drive motors, or hydraulic seed meter drive motors; seed conveyor system controllers, such as controllers for a belt seed delivery conveyor motor; marker controllers, such as a controller for a pneumatic or hydraulic actuator; or pesticide application rate controllers, such as metering drive controllers, orifice size or position controllers.

In an embodiment, examples of sensors 112 that may be used with tillage equipment include position sensors for tools such as shanks or discs; tool position sensors for such tools that are configured to detect depth, gang angle, or lateral spacing; downforce sensors; or draft force sensors. In an embodiment, examples of controllers 114 that may be used with tillage equipment include downforce controllers or tool position controllers, such as controllers configured to control tool depth, gang angle, or lateral spacing.

In an embodiment, examples of sensors 112 that may be used in relation to apparatus for applying fertilizer, insecticide, fungicide and the like, such as on-planter starter fertilizer systems, subsoil fertilizer applicators, or fertilizer sprayers, include: fluid system criteria sensors, such as flow sensors or pressure sensors; sensors indicating which spray head valves or fluid line valves are open; sensors associated with tanks, such as fill level sensors; sectional or system-wide supply line sensors, or row-specific supply line sensors; or kinematic sensors such as accelerometers disposed on sprayer booms. In an embodiment, examples of controllers 114 that may be used with such apparatus include pump speed controllers; valve controllers that are programmed to control pressure, flow, direction, PWM and the like; or position actuators, such as for boom height, subsoiler depth, or boom position.

In an embodiment, examples of sensors 112 that may be used with harvesters include yield monitors, such as impact plate strain gauges or position sensors, capacitive flow sensors, load sensors, weight sensors, or torque sensors associated with elevators or augers, or optical or other electromagnetic grain height sensors; grain moisture sensors, such as capacitive sensors; grain loss sensors, including impact, optical, or capacitive sensors; header operating criteria sensors such as header height, header type, deck plate gap, feeder speed, and reel speed sensors; separator operating criteria sensors, such as concave clearance, rotor speed, shoe clearance, or chaffer clearance sensors; auger sensors for position, operation, or speed; or engine speed sensors. In an embodiment, examples of controllers 114 that may be used with harvesters include header operating criteria controllers for elements such as header height, header type, deck plate gap, feeder speed, or reel speed; separator operating criteria controllers for features such as concave clearance, rotor speed, shoe clearance, or chaffer clearance; or controllers for auger position, operation, or speed.

In an embodiment, examples of sensors 112 that may be used with grain carts include weight sensors, or sensors for auger position, operation, or speed. In an embodiment, examples of controllers 114 that may be used with grain carts include controllers for auger position, operation, or speed.

In an embodiment, examples of sensors 112 and controllers 114 may be installed in unmanned aerial vehicle (UAV) apparatus or "drones." Such sensors may include cameras with detectors effective for any range of the electromagnetic spectrum including visible light, infrared, ultraviolet, near-infrared (NIR), and the like; accelerometers; altimeters; temperature sensors; humidity sensors; pitot tube sensors or other airspeed or wind velocity sensors; battery life sensors; or radar emitters and reflected radar energy detection apparatus; other electromagnetic radiation emitters and reflected electromagnetic radiation detection apparatus. Such controllers may include guidance or motor control apparatus, control surface controllers, camera controllers, or controllers programmed to turn on, operate, obtain data from, manage and configure any of the foregoing sensors. Examples are disclosed in US Pat. App. No. 14/831,165 and the present disclosure assumes knowledge of that other patent disclosure.

In an embodiment, sensors 112 and controllers 114 may be affixed to soil sampling and measurement apparatus that is configured or programmed to sample soil and perform soil chemistry tests, soil moisture tests, and other tests pertaining to soil. For example, the apparatus disclosed in U.S. Pat. No. 8,767,194 and 8,712,148 may be used, and the present disclosure assumes knowledge of those patent disclosures.

In an embodiment, sensors 112 and controllers 114 may comprise weather devices for monitoring weather conditions of fields. For example, the apparatus disclosed in U.S. Provisional Application No. 62/154,207, filed on Apr. 29, 2015, U.S. Provisional Application No. 62/175,160, filed on Jun. 12, 2015, U.S. Provisional Application No. 62/198,060, filed on Jul. 28, 2015, and U.S. Provisional Application No. 62/220,852, filed on Sep. 18, 2015, may be used, and the present disclosure assumes knowledge of those patent disclosures.

2.4. Process Overview—Agronomic Model Training

In an embodiment, the agricultural intelligence computer system 130 is programmed or configured to create an agronomic model. In this context, an agronomic model is a data structure in memory of the agricultural intelligence computer system 130 that comprises field data 106, such as identification data and harvest data for one or more fields. The agronomic model may also comprise calculated agronomic properties which describe either conditions which may affect the growth of one or more crops on a field, or properties of the one or more crops, or both. Additionally, an agronomic model may comprise recommendations based on agronomic factors such as crop recommendations, irrigation recommendations, planting recommendations, fertilizer recommendations, fungicide recommendations, pesticide recommendations, harvesting recommendations and other crop management recommendations. The agronomic factors may also be used to estimate one or more crop related results, such as agronomic yield. The agronomic yield of a crop is an estimate of quantity of the crop that is produced, or in some examples the revenue or profit obtained from the produced crop.

In an embodiment, the agricultural intelligence computer system 130 may use a preconfigured agronomic model to calculate agronomic properties related to currently received location and crop information for one or more fields. The preconfigured agronomic model is based upon previously processed field data, including but not limited to, identification data, harvest data, fertilizer data, and weather data. The preconfigured agronomic model may have been cross validated to ensure accuracy of the model. Cross validation may include comparison to ground truthing that compares predicted results with actual results on a field, such as a comparison of precipitation estimate with a rain gauge or sensor providing weather data at the same or nearby location or an estimate of nitrogen content with a soil sample measurement.

Figure 3:
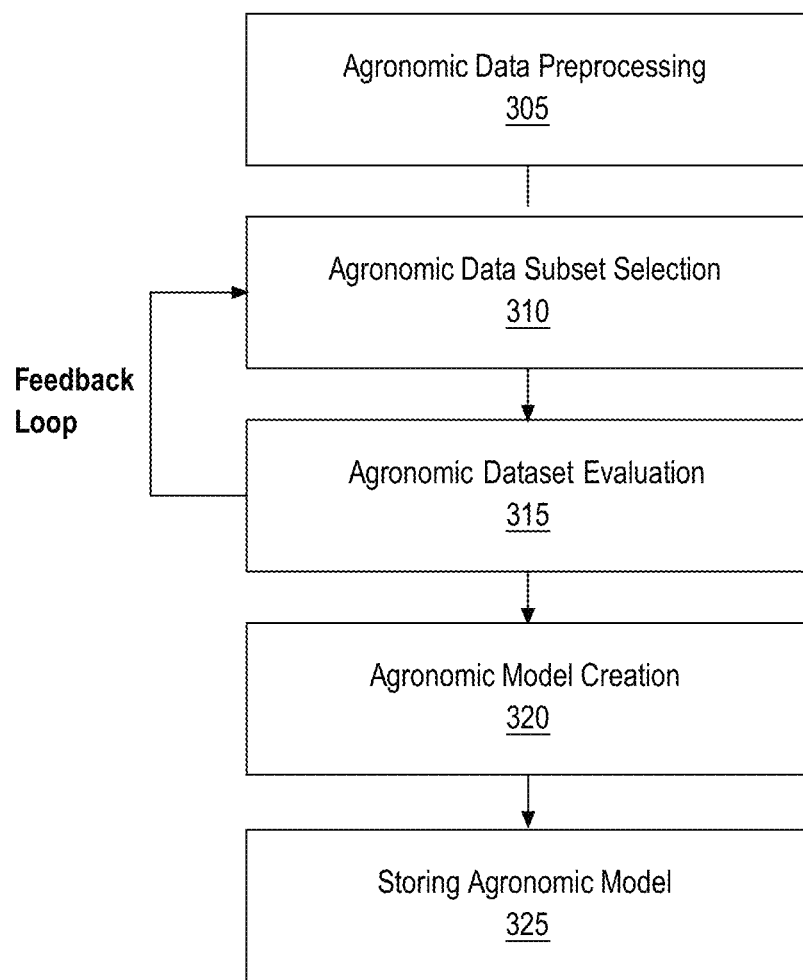
FIG. 3 illustrates a programmed process by which the agricultural intelligence computer system generates one or more preconfigured agronomic models using agronomic data provided by one or more data sources.

FIG. 3 illustrates a programmed process by which the agricultural intelligence computer system generates one or more preconfigured agronomic models using field data provided by one or more data sources. FIG. 3 may serve as an algorithm or instructions for programming the functional elements of the agricultural intelligence computer system 130 to perform the operations that are now described.

At block 305, the agricultural intelligence computer system 130 is configured or programmed to implement agronomic data preprocessing of field data received from one or more data sources. The field data received from one or more data sources may be preprocessed for the purpose of removing noise, distorting effects, and confounding factors within the agronomic data including measured outliers that could adversely affect received field data values. Embodiments of agronomic data preprocessing may include, but are not limited to, removing data values commonly associated with outlier data values, specific measured data points that are known to unnecessarily skew other data values, data smoothing, aggregation, or sampling techniques used to remove or reduce additive or multiplicative effects from noise, and other filtering or data derivation techniques used to provide clear distinctions between positive and negative data inputs.

At block 310, the agricultural intelligence computer system 130 is configured or programmed to perform data subset selection using the preprocessed field data in order to identify datasets useful for initial agronomic model generation. The agricultural intelligence computer system 130 may implement data subset selection techniques including, but not limited to, a genetic algorithm method, an all subset models method, a sequential search method, a stepwise regression method, a particle swarm optimization method, and an ant colony optimization method. For example, a genetic algorithm selection technique uses an adaptive heuristic search algorithm, based on evolutionary principles of natural selection and genetics, to determine and evaluate datasets within the preprocessed agronomic data.

At block 315, the agricultural intelligence computer system 130 is configured or programmed to implement field dataset evaluation. In an embodiment, a specific field dataset is evaluated by creating an agronomic model and using specific quality thresholds for the created agronomic model. Agronomic models may be compared and/or validated using one or more comparison techniques, such as, but not limited to, root mean square error with leave-one-out cross validation (RMSECV), mean absolute error, and mean percentage error. For example, RMSECV can cross validate agronomic models by comparing predicted agronomic property values created by the agronomic model against historical agronomic property values collected and analyzed. In an embodiment, the agronomic dataset evaluation logic is used as a feedback loop where agronomic datasets that do not meet configured quality thresholds are used during future data subset selection steps (block 310).

At block 320, the agricultural intelligence computer system 130 is configured or programmed to implement agronomic model creation based upon the cross validated agronomic datasets. In an embodiment, agronomic model creation may implement multivariate regression techniques to create preconfigured agronomic data models.

At block 325, the agricultural intelligence computer system 130 is configured or programmed to store the preconfigured agronomic data models for future field data evaluation.

2.5. Implementation Example—Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

For example, FIG. 4 is a block diagram that illustrates a computer system 400 upon which an embodiment of the invention may be implemented. Computer system 400 includes a bus 402 or other communication mechanism for communicating information, and a hardware processor 404 coupled with bus 402 for processing information. Hardware processor 404 may be, for example, a general purpose microprocessor.

Computer system 400 also includes a main memory 406, such as a random access memory (RAM) or other dynamic storage device, coupled to bus 402 for storing information and instructions to be executed by processor 404. Main memory 406 also may be used for storing temporary variables or other intermediate information during execution of instructions to be executed by processor 404. Such instructions, when stored in non-transitory storage media accessible to processor 404, render computer system 400 into a special-purpose machine that is customized to perform the operations specified in the instructions.

Computer system 400 further includes a read only memory (ROM) 408 or other static storage device coupled to bus 402 for storing static information and instructions for processor 404. A storage device 410, such as a magnetic disk, optical disk, or solid-state drive is provided and coupled to bus 402 for storing information and instructions.

Computer system 400 may be coupled via bus 402 to a display 412, such as a cathode ray tube (CRT), for displaying information to a computer user. An input device 414, including alphanumeric and other keys, is coupled to bus 402 for communicating information and command selections to processor 404. Another type of user input device is cursor control 416, such as a mouse, a trackball, or cursor direction keys for communicating direction information and command selections to processor 404 and for controlling cursor movement on display 412. This input device typically has two degrees of freedom in two axes, a first axis (e.g., x) and a second axis (e.g., y), that allows the device to specify positions in a plane.

Computer system 400 may implement the techniques described herein using customized hard-wired logic, one or more ASICs or FPGAs, firmware and/or program logic which in combination with the computer system causes or programs computer system 400 to be a special-purpose machine. According to one embodiment, the techniques herein are performed by computer system 400 in response to processor 404 executing one or more sequences of one or more instructions contained in main memory 406. Such instructions may be read into main memory 406 from another storage medium, such as storage device 410. Execution of the sequences of instructions contained in main memory 406 causes processor 404 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical disks, magnetic disks, or solid-state drives, such as storage device 410. Volatile media includes dynamic memory, such as main memory 406. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 402. Transmission media can also take the form of acoustic or light waves, such as those generated during radio-wave and infrared data communications.

Various forms of media may be involved in carrying one or more sequences of one or more instructions to processor 404 for execution. For example, the instructions may initially be carried on a magnetic disk or solid-state drive of a remote computer. The remote computer can load the instructions into its dynamic memory and send the instructions over a telephone line using a modem. A modem local to computer system 400 can receive the data on the telephone line and use an infra-red transmitter to convert the data to an infra-red signal. An infra-red detector can receive the data carried in the infrared signal and appropriate circuitry can place the data on bus 402. Bus 402 carries the data to main memory 406, from which processor 404 retrieves and executes the instructions. The instructions received by main memory 406 may optionally be stored on storage device 410 either before or after execution by processor 404.

Computer system 400 also includes a communication interface 418 coupled to bus 402. Communication interface 418 provides a two-way data communication coupling to a network link 420 that is connected to a local network 422. For example, communication interface 418 may be an integrated services digital network (ISDN) card, cable modem, satellite modem, or a modem to provide a data communication connection to a corresponding type of telephone line. As another example, communication interface 418 may be a local area network (LAN) card to provide a data communication connection to a compatible LAN. Wireless links may also be implemented. In any such implementation, communication interface 418 sends and receives electrical, electromagnetic or optical signals that carry digital data streams representing various types of information.

Network link 420 typically provides data communication through one or more networks to other data devices. For example, network link 420 may provide a connection through local network 422 to a host computer 424 or to data equipment operated by an Internet Service Provider (ISP) 426. ISP 426 in turn provides data communication services through the world wide packet data communication network now commonly referred to as the "Internet" 428. Local network 422 and Internet 428 both use electrical, electromagnetic or optical signals that carry digital data streams. The signals through the various networks and the signals on network link 420 and through communication interface 418, which carry the digital data to and from computer system 400, are example forms of transmission media.

Computer system 400 can send messages and receive data, including program code, through the network(s), network link 420 and communication interface 418. In the Internet example, a server 430 might transmit a requested code for an application program through Internet 428, ISP 426, local network 422 and communication interface 418.

The received code may be executed by processor 404 as it is received, and/or stored in storage device 410, or other non-volatile storage for later execution.

3. Nutrient Model Correction
3.1. Functional Overview

Figure 7:
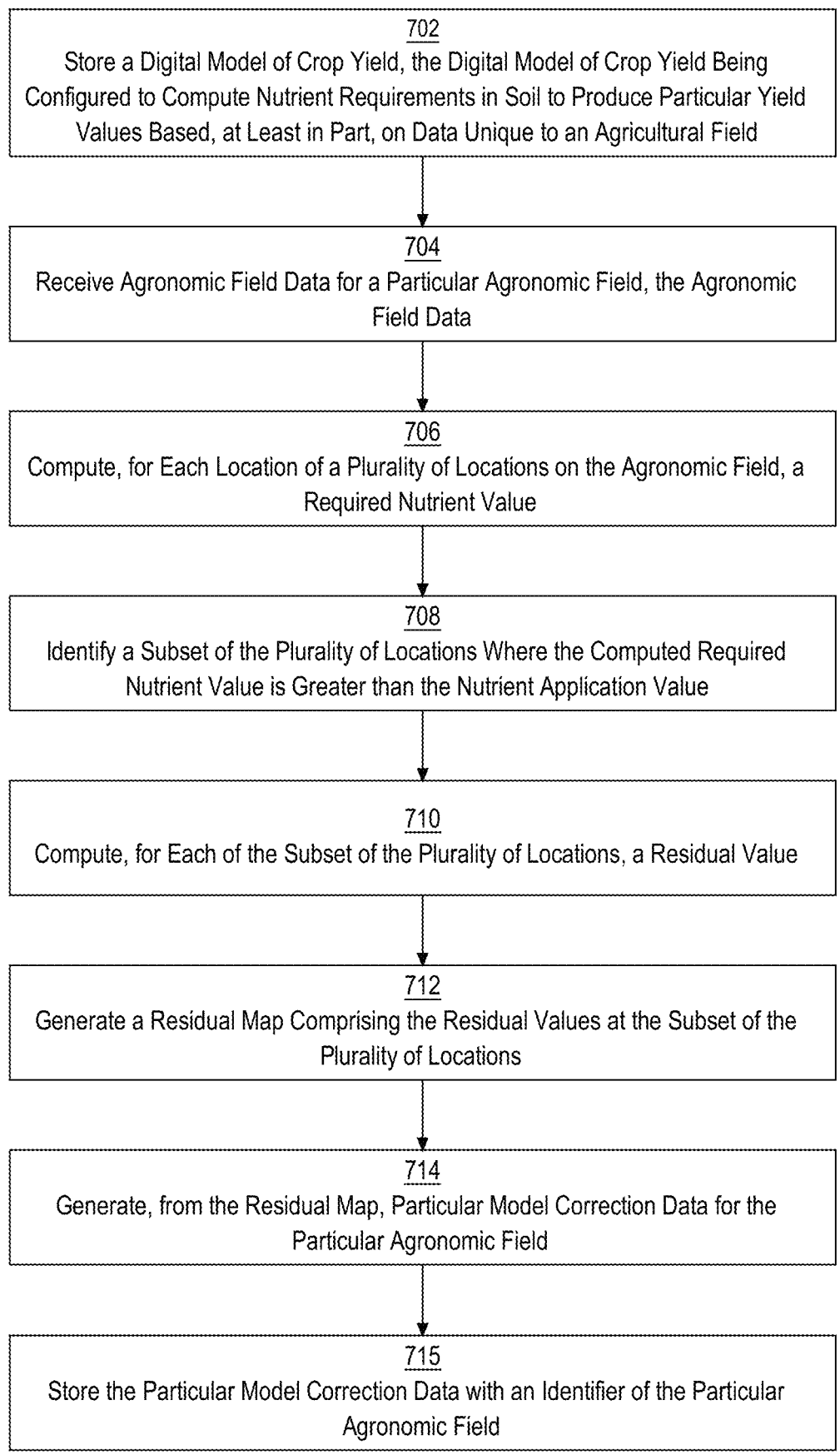
FIG. 7 depicts an example method for correcting outputs of a nutrient model using historical data.

FIG. 7 depicts an example method for correcting outputs of a nutrient model using historical data.

At step 702, a digital model of crop growth is stored in a computing system, the digital model of crop growth being configured to compute nutrient requirements in soil to produce particular yield values. The digital model of crop growth comprises one or more trained algorithms configured to generate nutrient requirements for soil based on one or more inputs. The one or more inputs may include weather data, soil data, management data, planting data, and/or other data relating to a crop, field, or external elements. Example nutrient models are described in U.S. Pat. No. 9,519,861 and U.S. patent application Ser. No. 14/968,728, the contents of both of which are incorporate by reference as if fully set forth herein. Other example nutrient models may incorporate machine learning techniques to compute a required nutrient application trained using historical data with inputs of at least total yield and outputs of nutrient levels in the soil during a crop's development. The nutrients may include any of nitrogen, potassium, or phosphorus.

At step 704, agronomic field data for a particular agronomic field is received. For example, the agricultural intelligence computing system may receive agronomic field data for a particular agronomic field comprising one or more input parameters for each of a plurality of locations on the agronomic field, nutrient application values for each of the plurality of locations, and measured yield values for each of the plurality of locations. The agronomic field data may be received from a client computing device, one or more external server computers, and/or one or more agricultural implements on a field. In an embodiment, agronomic field data is computed at the agricultural intelligence computing system.

The one or more input parameters may comprise parameters specific to an agronomic field. For example, the one or more input parameters may include elevation of the plurality of locations, soil pH for the plurality of locations, cation exchange capacity, soil moisture, or other spatially distributed values specific to the agronomic field. The one or more input parameters may be used to generate a spatial map of input parameters, the spatial map comprising the input parameters for a plurality of locations in a two-dimensional grid.

The agronomic field data comprises historical data values for prior growth cycles, such as prior nutrient application values and corresponding yield measurements for the locations where the nutrients were applied. The nutrient application values comprise data indicating an amount of nutrient that was applied to an agronomic field during a past growth cycle. For example, a field manager computing device and/or agricultural implement may identify, for each location on an agronomic field, the amount of a nutrient that was applied to the agronomic field. The measured yield values comprise data indicating a total for the agronomic field to which the nutrient was applied.

In addition to the applied nutrient values and the measured yield values, the agricultural intelligence computing system may receive model input values for the agronomic field for the prior growth cycles. The model input values may include weather data, soil data, management data, planting data, and/or other data relating to a crop, field, or external elements during the time period to which the nutrient application values and measured yield values correspond. Model input values may include the one or more input parameters of the agronomic field data. For example, elevation data may comprise an input to the digital model of crop growth as well as an input for the generation of model correction data. Additionally or alternatively, the one or more input parameters may include parameters that are not part of the model input values. For example, elevation data may not comprise an input to the digital model of crop growth but comprise an input for the generation of model correction data.

At step 706, a required nutrient value is computed for each locations of the plurality of locations using the digital model of crop growth. The required nutrient value, as used herein, refers to a value indicating a required amount of a nutrient to be applied to the field to produce a particular yield value. The agricultural intelligence computer system may use the model input parameters, the measured crop growth to compute, and the digital model of crop growth to compute, for the model input parameters, the amount of a nutrient that has to be applied to the agronomic field to generate the measured yield values in the prior years to which the measured yield values and the model input values correspond.

At step 708, a subset of the plurality of locations where the computed required nutrient value is greater than the nutrient application value is identified. For example, after computing the required nutrient value for each location to produce the measured yield, the agricultural intelligence computing system may compare the computed required nutrient values with the nutrient application values indicating an amount of nutrient that was actually applied to the field. Each location in which the computed required nutrient value is higher than the nutrient application value indicates that the digital model of crop growth incorrectly computed the required nutrient value, as a lower application of nutrients were actually required to produce the measured crop growth.

At step 710, a residual value for each of the subset of the plurality of locations is computed. The residual value, as used herein, refers to a difference between the required nutrient value and the nutrient application value. For example, the agricultural intelligence computer system may subtract the nutrient application value for a specific year and location from the computed required nutrient value for the specific year and location to generate a residual value for the year and location. The residual value thus encapsulates the degree to which the digital yield model over estimated the required nutrients for application to the agronomic field to generate a specific crop growth. In embodiments where the digital model of crop growth generates probabilistic estimates of nutrient requirements, the residual value may be computed as a difference between the nutrient application value and a probabilistic mean of required nutrient values for the location and year or, value that is one or more standard deviations above the probabilistic mean, or a peak of the error range for the required nutrient value.

At step 712, a residual map comprising residual values at the subset of the plurality of locations is generated. The residual map, as used herein, refers to a spatial composition of residual values, such that each residual value corresponds to a spatial location on the agronomic field. The residual map may be stored as a series of corresponding values in a data record where each row of the record comprises data identifying the residual value and a location of the residual value. The location may be stored as a location on a grid, latitude and longitude values, and/or any other means of identifying a location in two dimensions.

At step 714, particular model correction data for the particular agronomic field is generated. For example, the agricultural intelligence computing system may generate correction data using the one or more input parameters for the plurality of locations on the agronomic field and the residual map. By generating the correction data for a particular agronomic field using spatial input parameters, the agricultural intelligence computing system is able to account for unknown effects of features specific to an agronomic field in combination with understood spatially distributed parameters. For example, elevation differences may have minor effects on the absorption or loss of nutrients for one agronomic field but have larger effects for a different agronomic field.

3.2. Model Correlations and Corrections

In an embodiment, the agricultural intelligence computing system generates correlations between the one or more input parameters and the residual map. For example, the agricultural intelligence computing system may normalize the residual maps and the maps of the one or more input parameters. Using the normalized maps, the agricultural intelligence computing system may compute correlations between the residual values in the residual maps and the one or more input parameters for corresponding locations. The correlation values may be used to identify input parameters that are most closely related to the residual values. For example, the agricultural intelligence computing system may select input parameters that have correlation values above a specific threshold for use in generating model correction data.

In an embodiment, the agricultural intelligence computing system generates model correction data by computing a relationship between the residual values and the one or more input parameters. For example, the agricultural intelligence computing system may use linear regression techniques to generate weight values according to:

$$\min_{a_1 \ldots a_n} R - \sum_{i=1}^{n} \sum_{j=1}^{m} a_i X_{i,j}$$

where $\alpha_i$-$\alpha_n$ comprise matrices of weight values where each element of a matrix corresponds to a different location, comprise matrices of the one or more input parameters where each element of a matrix corresponds to a different location, R is the residual map, n is the number of input parameters, and m is a number of years of available data. The techniques described herein may be employed with any combination of one or more input parameters. For example, residual maps may be correlated with only elevation maps across a plurality of years or correlated with a combination of elevation maps and pH maps. In an embodiment, the input parameters in the above equation correspond only to input parameters identified as having a high correlation to the residual values.

In an embodiment, the agricultural intelligence computing system generates model correction data using a machine learning system. For example, the agricultural intelligence computing system may train a convolutional neural network using residual maps from prior years, yield maps from prior years, and parameter maps from prior years. The machine learning system may be trained using matrices of values representing agronomic yield and matrices of values representing corresponding parameters for corresponding locations as inputs and the residual values as outputs. In an embodiment, the machine learning system is only trained using data at locations that comprised residual values. Additionally or alternatively, locations with no residual values may be assigned a residual value of zero, thereby allowing the machine learning system to be trained for the entire map.

The agricultural intelligence computing system may generate model correction data as data used to augment the digital model of crop growth. For example, if the digital model of crop growth incorporates multiple parameters to compute a required agronomic yield, the agricultural intelligence computing system may generate an additional parameter that includes a location-based weight value and a corresponding parameter value. Multiple additional terms may be used if a plurality of input parameters were used to generate the model correction data, the additional terms each including a location-based weight value and a corresponding parameter value. As an example, a location-based weight value may comprise an element of matrix $\alpha_i$.

The agricultural intelligence computing system may generate model correction data as post processing data to augment an output of the digital model of crop growth. For example, the model correction data may comprise a trained machine learning system that generates residual values based on inputs of at least yield and one or more input parameters. The model correction data may include post-processing instructions which, when executed, cause the agricultural intelligence computing system to use the trained machine learning system to compute residual values for a current year using requested yield values and the one or more input parameters for the agronomic field. The post-processing instructions may then cause the agricultural intelligence computing system to augment required nutrient values for the agronomic field, such as by subtracting the residual values from the required nutrient values for corresponding locations.

At step 714, model correction data is stored with an identifier of the particular agronomic field. For example, the agricultural intelligence computing system may store the model correction data temporarily prior to using the model correction data to augment the digital model of crop growth. The augmented digital model of crop growth may be stored with data identifying the particular field. Additionally or alternatively, post processing instructions may be stored with data identifying the particular agronomic field. The data identifying the particular agronomic field may include one or more unique identifiers used to identify the particular agronomic field.

The agricultural intelligence computing system may perform the process described herein for a plurality of agronomic fields. For example, the agricultural intelligence computing system may generate model correction data for each of a plurality of agronomic fields, each of which is then stored with data identifying the agronomic field to which the model correction data corresponds. Thus, when the agricultural intelligence computing system receives a request to generate nutrient requirement data for the particular field, the agricultural intelligence computing system identifies the model correction data and/or augmented digital model of crop growth that corresponds to the particular agronomic field and uses the model correction data and/or augmented model of crop growth to compute the nutrient requirements for the particular agronomic field in order to reach a particular yield value.

3.3. Residual Map Embodiments

Section 3.1. describes a generation of residual maps based on locations where the computed required nutrient value is greater than the nutrient application value. In the example of section 3.1. and FIG. 7, the system identifies each location where the required nutrient value is greater than the nutrient application value and computes a residual from those two values. In additional or alternative embodiments, the system additionally computes residual values for locations where the nutrient application value is greater than the required nutrient value based on additional nutrient data for the location.

In an embodiment, the agricultural intelligence computer system receives additional nutrient data for one or more locations on the agricultural field. The additional nutrient data may include nutrient levels in the soil and/or evidence of nutrient stress on a crop. For example, the server computer may receive data from one or more sensors on the agricultural field and/or from a field manager computing device identifying an amount of nutrient in the soil shortly before or after a crop has been harvested. As another example, the agricultural intelligence computer system may receive imagery of a crop and, based on the imagery, determine that the crop is suffering from nutrient stress.

In one embodiment, the agricultural intelligence computer system uses measurements and/or estimates of remaining nutrients in the agricultural field to compute the residual values. For locations where the nutrient application value is lower than the required nutrient value, the agricultural intelligence computer system may identify the residual value as based on the amount of nutrient remaining in the soil shortly prior to or after the harvesting of the crop and the difference between the required nutrient value and the nutrient application value.

As a practical example, the server computer may compute a required nitrogen application rate of 120 lb/acre to produce a measured yield of 180 bu/acre. If 150 lb/acre of nitrogen was applied to the field, then the difference between the nutrient application value and the required nutrient value is 30 lb/acre. If 20 lb/acre remains in the soil after harvesting, the agricultural intelligence computer system may compute a residual value as 20 lb/acre (the remaining nutrient value) minus 30 lb/acre (the difference between required and applied nutrient values). The residual value of −10 lb/acre indicates that the digital model of crop growth underestimated the amount of nutrient the crop would need to reach they measured yield by 10 lb/acre. If 50 lb/acre remains in the soil after harvesting, the agricultural intelligence computer system may compute the residual value as 50 lb/acre −30 lb/acre=20 lb/acre. The residual value of +20 lb/acre indicates that the digital model of crop growth overestimated the amount of nutrient the crop would need to reach the measured yield by 20 lb/acre.

In another embodiment, the agricultural intelligence computer system uses evidence of nutrient stress to determine the residual values. For locations where the nutrient application value is lower than the required nutrient value, the agricultural intelligence computer system may identify the residual value as the remaining amount of nutrient in the soil if the agricultural intelligence computer system receives additional data indicating that the crop is suffering from nutrient stress. For example, the server computer may compute a required nitrogen application rate of 120 lb/acre to produce a measured yield of 180 bu/acre. If 150 lb/acre of nitrogen was applied to the field, then the difference between the nutrient application value and the required nutrient value is 30 lb/acre. If the agricultural intelligence computer system receives evidence of crop stress at the location, such as through imagery or data directly identifying nutrient stress at the location, the agricultural intelligence computer system may compute the residual value as −30 lb/acre, thereby indicating that the digital model of crop growth underestimated the amount of nutrient the crop would need to reach the measured yield by 10 lb/acre.

The server computer may use any combination of the above techniques in order to generate the residual maps. For example, the server computer may compute residual values as the difference between the required nutrient value and the nutrient application value for each location where the required nutrient value is greater than the nutrient application value. Thus, if, at a first location, the required nutrient application value was 120 lb/acre and the nutrient application value was 100 lb/acre, the residual value may be computed as +20 lb/acre. If, at a second location, the required nutrient value was 120 lb/acre, the nutrient application value was 130 lb/acre and the crop showed evidence of nutrient stress, the residual value may be computed as −10 lb/acre.

3.4. Additional Model Correction Uses

In an embodiment, the agricultural intelligence computing system uses the methods described herein to create a recommendation for a nutrient application for a particular agronomic field. For example, the agricultural intelligence computing system may receive a request to generate a recommendation for applying a nutrient to a particular agronomic field in order to generate a particular yield, maximize yield for the field, and/or generate a nutrient application recommendation based on one or more other parameters, such as minimizing cost and/or maximizing profit. The agricultural intelligence computing system may use the digital model of crop growth and the model correction data to generate a recommendation for how much of a nutrient to apply to a field to create the intended result. For example, the agricultural intelligence computing system may use an augmented mode of crop growth corresponding to the particular field to generate the recommendation. As another example, the agricultural intelligence computing system may generate a required nutrient value for each location on the agronomic field using a digital model of crop growth and augment the output of the digital model of crop growth using the model correction data to generate the nutrient recommendation for each location. The agricultural intelligence computing system may then send the nutrient recommendation to a field manager computing device.

In an embodiment, the agricultural intelligence computing system uses the nutrient recommendation to generate a script for an agricultural implement. The script may comprise one or more sets of instructions which, when executed by the agricultural implement, cause the agricultural implement to release a nutrient onto the agronomic field as per the nutrient recommendation. For example, the agricultural intelligence computing system may use nutrient recommendation to create application parameters for a nutrient release valve that describe an amount of a nutrient to release on one or more fields. The agricultural intelligence computing system may send the application parameters to an application controller which implements the application parameters using an agricultural implement, such as by cause the nutrient release valve to release the recommended amount of nutrient onto the agronomic field.

4. Benefits of Certain Embodiments

Using the techniques described herein, a computer can deliver nutrient recommendations with higher accuracy and efficiency that was otherwise possible. For example, a complex model requiring a large amount of initial input would be required to capture all aspects of a nutrient recommendation for each field. By using a generalized nutrient model and residual data relating to particular fields, the computer is able to capture latent inherencies of a particular field and use that data to augment the output of the model of crop growth. Thus, the techniques described herein improve upon previous yield modeling techniques by reducing the amount of data required to generate an accurate recommendation, increase the efficiency with which the digital model of crop growth is run, and increasing the locational accuracy of a digital model of crop growth. Additionally, the techniques described herein may be used to create application parameters for application controller, thereby improving the performance of farming implements controlled by the application controller.

5. Extensions and Alternatives

In the foregoing specification, embodiments have been described with reference to numerous specific details that may vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction.

What is claimed is:

1. A method for increasing accuracy of digital models of crop growth based on nutrient values in a computing system, the method comprising:
   storing, in the computing system, a digital model of crop growth, the digital model of crop growth being configured to compute nutrient requirements in soil to produce particular yield values
   receiving agronomic field data for a particular agronomic field, the agronomic field data comprising elevation data for each of a plurality of locations on the agronomic field, nutrient application values for each of the plurality of locations, and measured yield values, each of the measured yield values specific to one of the plurality of locations; wherein each nutrient application value of the nutrient application values, for a location, of the plurality of locations, indicates an amount of nutrient that was applied to the location during a past growth cycle;
   computing, for each location of the plurality of locations on the agronomic field, using the digital model of crop growth, a required nutrient value indicating a required amount of nutrient to be applied to produce the measured yield values;
   identifying a subset of the plurality of locations, for which the computed required nutrient value is greater than the nutrient application value;
   computing, for each of the subset of the plurality of locations, a residual value comprising a difference between the required nutrient value and the nutrient application value;
   generating a residual map comprising the residual values at the subset of the plurality of locations;
   generating, from the residual map and the elevation data for each of the plurality of locations, particular model correction data, which is specific to the particular agronomic field and separate from the digital model of crop growth; and
   storing the particular model correction data with an identifier of the particular agronomic field for use with the digital model of crop growth for the particular agronomic field to compute nutrient requirements in soil of the particular agronomic field to produce the particular yield values on the particular agronomic field.

2. The method of claim 1, further comprising:
   receiving particular agronomic field data for the agronomic field;
   using the particular agronomic field data for the agronomic field and the digital model of crop growth, computing, for each location of the plurality of locations, a particular nutrient value indicating a recommended amount of nutrient to apply to the agronomic field;
   generating a digital map of particular nutrient values, the digital map including the particular nutrient value for each location of the plurality of locations; and using the particular model correction data, adjusting the digital map of particular nutrient values, the particular model correction data comprising post-processing instructions for adjusting nutrient values for the particular agronomic field.

3. The method of claim 1, further comprising:
generating a plurality of spatial parameter maps, one of the spatial parameter maps comprising the elevation data, and another one of the spatial parameter maps including a parameter for each of the plurality of locations on the agronomic field, where the parameter is different than the elevation data of the particular agronomic field;
using digitally programmed logic, correlating the spatial parameter maps with the residual map; and
generating the model correction data based, at least in part, on the correlations of the spatial parameter maps with the residual map.

4. The method of claim 1, further comprising:
using one or more input parameters for each of the plurality of locations on the agronomic field, generating a plurality of spatial parameter maps for a plurality of years, each of the plurality of spatial parameter maps comprising an input parameter of the one or more input parameters for a different year of the plurality of years;
generating a plurality of residual maps for the plurality of years, the plurality of residual maps comprising the residual map;
using digitally programmed logic, correlating the plurality of spatial parameter maps with the plurality of residual maps; and
generating the model correction data further based on the correlations of the spatial parameter maps with the plurality of residual maps.

5. The method of claim 1, further comprising:
storing model correction data for a plurality of different agronomic fields;
receiving particular input parameter data for the particular agronomic field;
identifying the model correction data with the identifier of the particular agronomic field and, in response, using the digital model and the model correction data stored with the identifier of the particular agronomic field in combination with the digital model of crop growth, to compute recommended nutrient values for the particular field; and
sending the recommended nutrient values to a client computing device.

6. The method of claim 1, further comprising:
storing model correction data for a plurality of different agronomic fields;
receiving particular input parameter data for the particular agronomic field;
identifying the model correction data with the identifier of the particular agronomic field and, in response, using the digital model and the model correction data stored with the identifier of the particular agronomic field in combination with the digital model of crop growth, to compute recommended nutrient values for the particular field; and
generating a script which, when executed by one or more processors, causes an agricultural implement to release the nutrient at the recommended nutrient values onto the particular agronomic field.

7. A system comprising:
one or more processors;
a memory storing instructions which, when executed by the one or more processors, cause performance of:
storing a digital model of crop growth, the digital model of crop growth being configured to compute nutrient requirements in soil to produce particular yield values;
receiving agronomic field data for a particular agronomic field, the agronomic field data comprising elevation data for each of a plurality of locations on the agronomic field, nutrient application values for each of the plurality of locations, and measured yield values, each of the measured yield values specific to one of the plurality of locations;
wherein a nutrient application value, of the nutrient application values, for a location, of the plurality of locations, indicates an amount of nutrient that was applied to the location during a past growth cycle;
using the digital model of crop growth, computing, for each location of the plurality of locations on the agronomic field, a required nutrient value indicating a required amount of nutrient to be applied to produce the measured yield values;
identifying a subset of the plurality of locations, for which the computed required nutrient value is greater than the nutrient application value;
computing, for each of the subset of the plurality of locations, a residual value comprising a difference between the required nutrient value and the nutrient application value;
generating a residual map comprising the residual values at the subset of the plurality of locations;
generating, from the residual map and the elevation data for each of the plurality of locations, particular model correction data, which is specific to the particular agronomic field and separate from the digital model of crop growth; and
storing the particular model correction data with an identifier of the particular agronomic field for use with the digital model of crop growth for the particular agronomic field.

8. The system of claim 7, wherein the instructions, when executed by the one or more processors, further cause performance of:
receiving particular agronomic field data for the agronomic field;
using the particular agronomic field data for the agronomic field and the digital model of crop growth, computing, for each location of the plurality of locations, a particular nutrient value indicating a recommended amount of nutrient to apply to the agronomic field;
generating a digital map of particular nutrient values, the digital map including the particular nutrient value for each location of the plurality of locations; and
using the particular model correction data, adjusting the digital map of particular nutrient values, the particular model correction data comprising post-processing instructions for adjusting nutrient values for the particular agronomic field.

9. The system of claim 7, wherein the instructions, when executed by the one or more processors, further cause performance of using one or more input parameters for each of the plurality of locations on the agronomic field, generating a plurality of spatial parameter maps, each of the plurality of spatial parameter maps comprising a different input parameter of the one or more input parameters;

using digitally programmed logic, correlating the spatial parameter maps with the residual map; and generating the model correction data further based on the correlations of the spatial parameter maps with the residual map.

10. The system of claim 7, wherein the instructions, when executed by the one or more processors, further cause performance of:

generating a plurality of spatial parameter maps for a plurality of years, each of the plurality of spatial parameter maps comprising either the elevation data or one or more input parameters for each of the plurality of locations on the agronomic field for a different year of the plurality of years;

generating a plurality of residual maps for the plurality of years, the plurality of residual maps comprising the residual map;

using digitally programmed logic, correlating the plurality of spatial parameter maps with the plurality of residual maps; and generating the model correction data based, at least in part, on the correlations of the spatial parameter maps with the plurality of residual maps.

11. The system of claim 7, wherein the instructions, when executed by the one or more processors, further cause performance of:

storing model correction data for a plurality of different agronomic fields;

receiving particular input parameter data for the particular agronomic field;

identifying the model correction data with the identifier of the particular agronomic field and, in response, using the digital model and the model correction data stored with the identifier of the particular agronomic field in combination with the digital model of crop growth, to compute recommended nutrient values for the particular field; and sending the recommended nutrient values to a client computing device.

12. The system of claim 7, wherein the instructions, when executed by the one or more processors, further cause performance of:

storing model correction data for a plurality of different agronomic fields;

receiving particular input parameter data for the particular agronomic field;

identifying the model correction data with the identifier of the particular agronomic field and, in response, using the digital model and the model correction data stored with the identifier of the particular agronomic field in combination with the digital model of crop growth, to compute recommended nutrient values for the particular field; and generating a script which, when executed by one or more processors, causes an agricultural implement to release the nutrient at the recommended nutrient values onto the particular agronomic field.

* * * * *